United States Patent
Habu et al.

[11] Patent Number: 6,078,073
[45] Date of Patent: Jun. 20, 2000

[54] SEMICONDUCTOR APPARATUS FORMED BY SAC (SELF-ALIGNED CONTACT) METHOD AND MANUFACTURING METHOD THEREFOR

[75] Inventors: Mariko Habu; Kazumasa Sunouchi; Masami Aoki, all of Yokohama; Tohru Ozaki, Tokyo, all of Japan

[73] Assignee: Kabushiki Kaisha Toshiba, Kawasaki, Japan

[21] Appl. No.: 08/878,208

[22] Filed: Jun. 18, 1997

[30] Foreign Application Priority Data

Jun. 19, 1996 [JP] Japan ................................. 8-158379
Jun. 16, 1997 [JP] Japan ................................. 9-158464

[51] Int. Cl.[7] ................................................ H01L 27/108
[52] U.S. Cl. .......................... 257/296; 257/303; 257/306; 257/758
[58] Field of Search ................................. 257/296, 303, 257/306, 344, 336, 758; 438/152, 305, 300, 299, 303, 253, 254, 306, 723, 595

[56] References Cited

U.S. PATENT DOCUMENTS

| | | | |
|---|---|---|---|
| 4,997,790 | 3/1991 | Woo et al. ................................. | 438/595 |
| 5,183,770 | 2/1993 | Ayukawa ................................. | 438/303 |
| 5,338,700 | 8/1994 | Dennison et al. ...................... | 257/296 |
| 5,356,834 | 10/1994 | Sugimoto et al. ...................... | 438/595 |
| 5,366,590 | 11/1994 | Kadomura ............................. | 438/723 |
| 5,401,681 | 3/1995 | Dennison ............................... | 438/253 |
| 5,545,584 | 8/1996 | Wuu et al. ............................. | 438/152 |
| 5,591,664 | 1/1997 | Wang et al. ........................... | 438/254 |
| 5,691,561 | 11/1997 | Goto ..................................... | 257/758 |
| 5,702,972 | 12/1997 | Tsai et al. ............................. | 438/305 |
| 5,763,312 | 6/1998 | Jeng et al. ............................. | 438/303 |

FOREIGN PATENT DOCUMENTS 3-38034  2/1991  Japan .
5-283359 10/1993 Japan .

*Primary Examiner*—Sara Crane
*Attorney, Agent, or Firm*—Oblon, Spivak, McClelland, Maier & Neustadt, P.C.

[57] ABSTRACT

A gate electrode having a first insulating film laminated in the upper portion thereof is formed on a gate insulating film formed on a semiconductor substrate. A side wall is formed on the side wall of the gate electrode, and an insulating film is formed to cover the gate electrode and the side wall. Ion implantation is performed through the insulating film so that a diffusion layer is formed on the semiconductor substrate. An interlayer dielectric film is formed, and then the interlayer dielectric film and the insulating film are selectively etched so that an opening portion for exposing the gate insulating film is formed in a self-align manner with the gate electrode. Then, the gate insulating film in the bottom portion of the opening portion is removed so that the surface of the semiconductor substrate is exposed. Then, a wiring layer connected to the exposed surface of the semiconductor substrate is formed.

7 Claims, 27 Drawing Sheets

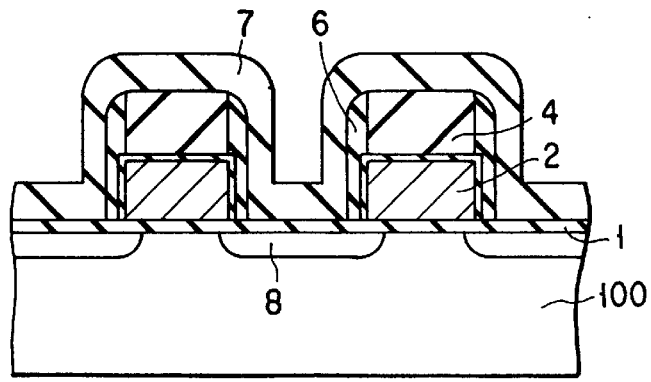
F I G. 5A
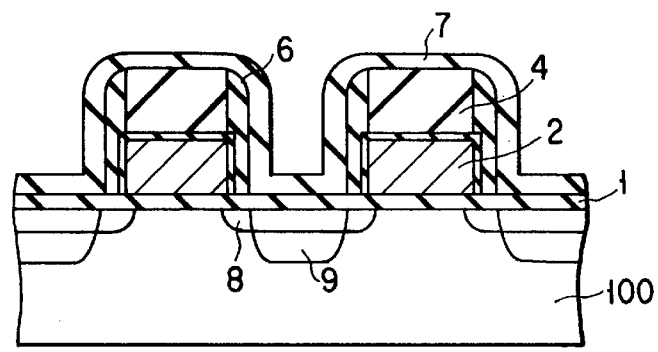
F I G. 5B
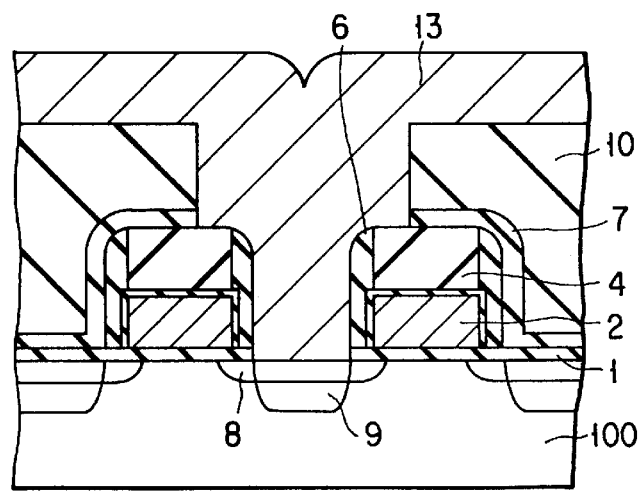
F I G. 5C
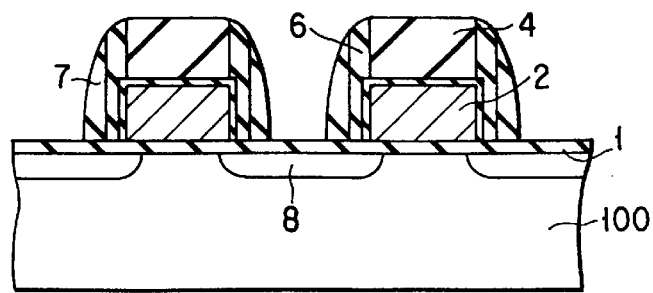
F I G. 5D

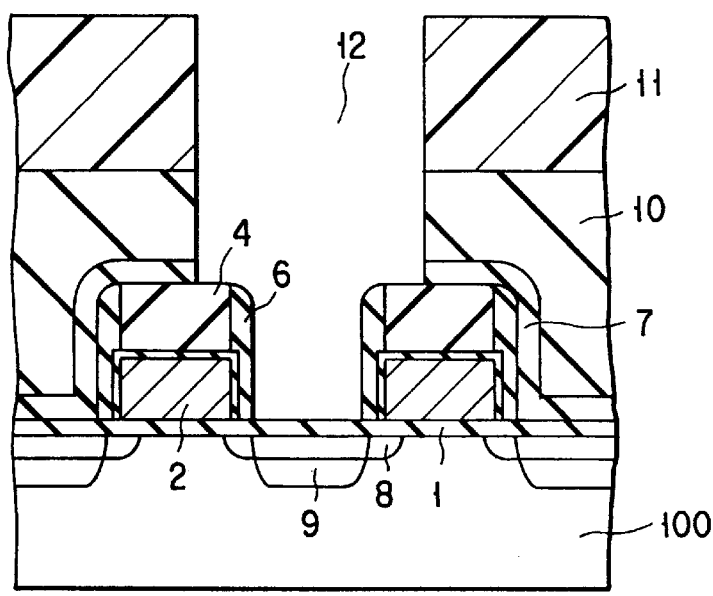
F I G. 6A
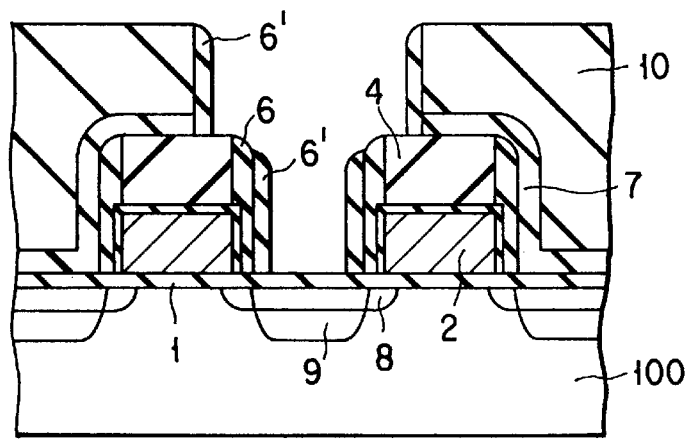
F I G. 6B
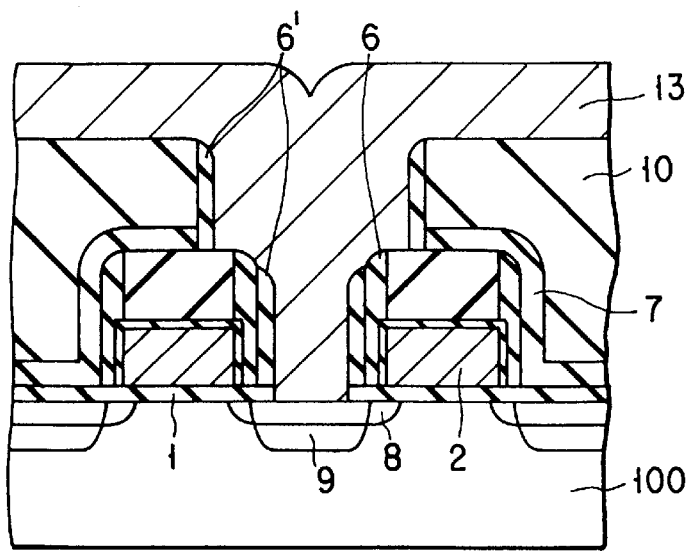
F I G. 6C

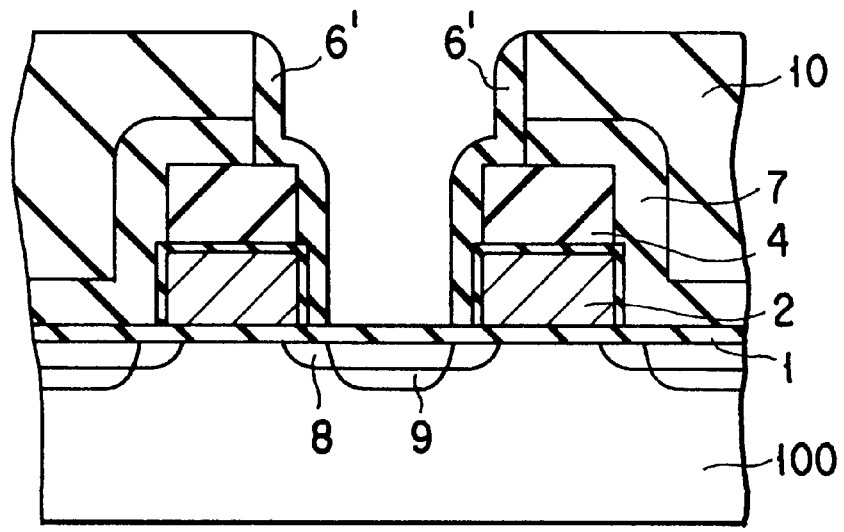
F I G. 7D
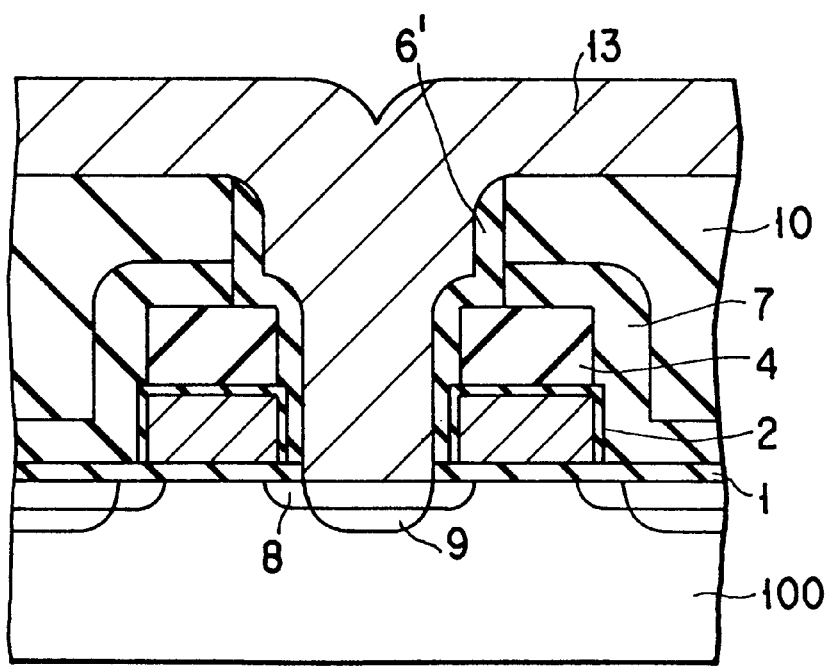
F I G. 7E

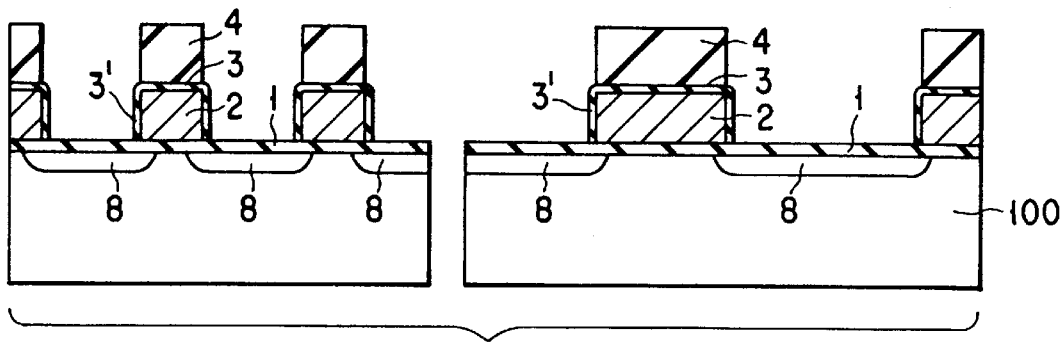
F I G. 12A
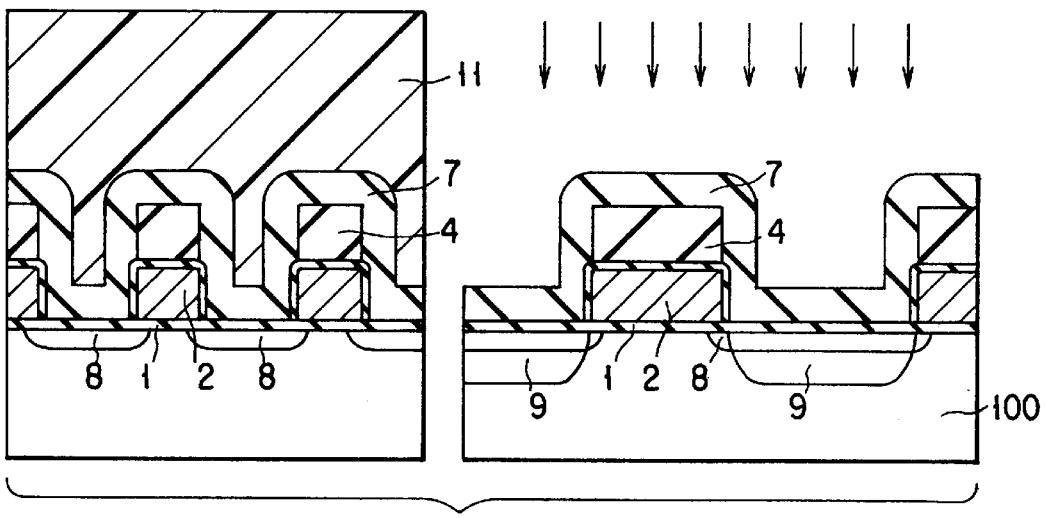
F I G. 12B
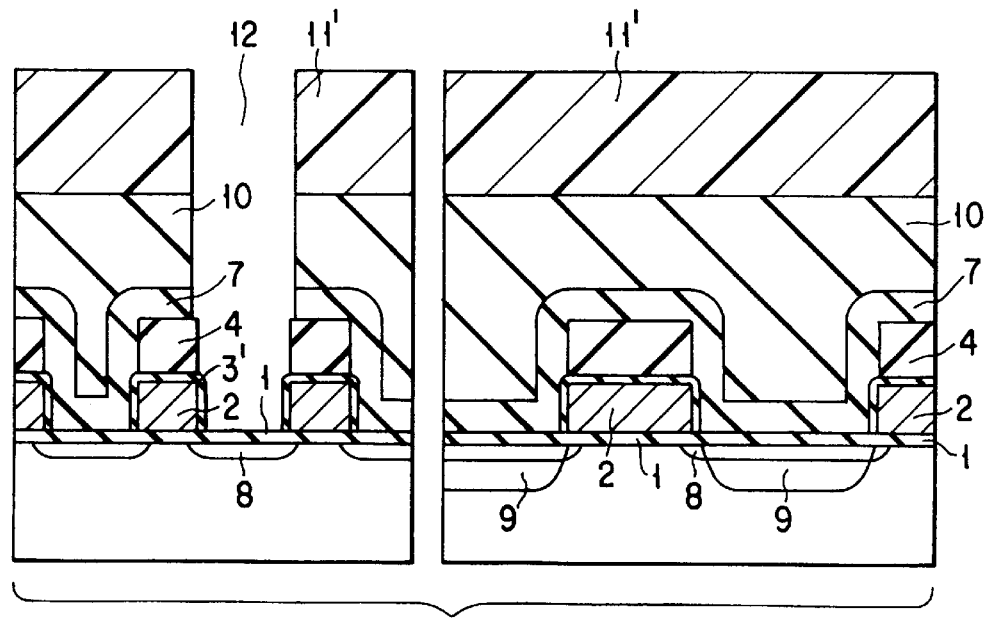
F I G. 12C

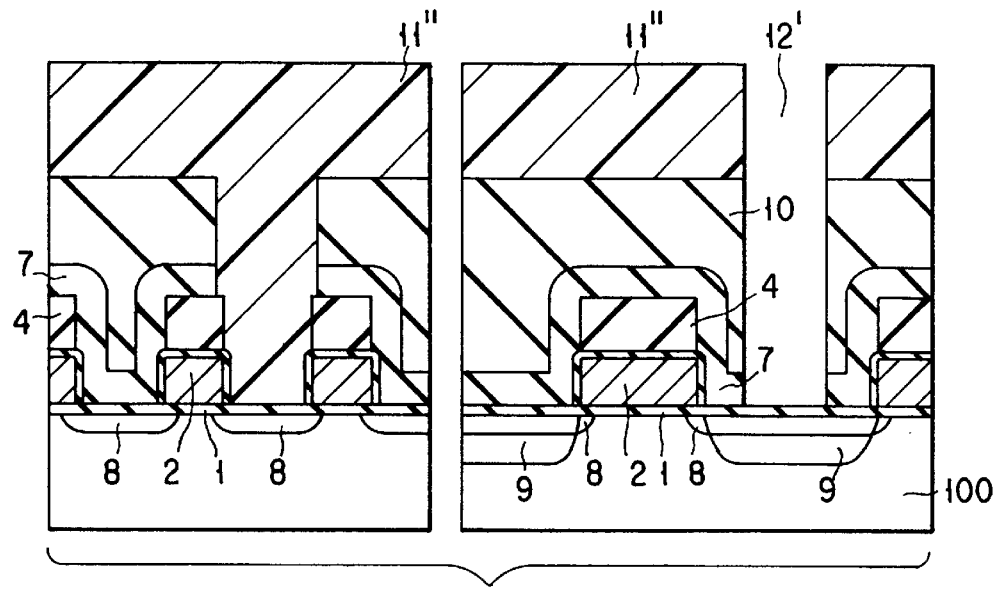
F I G. 12D
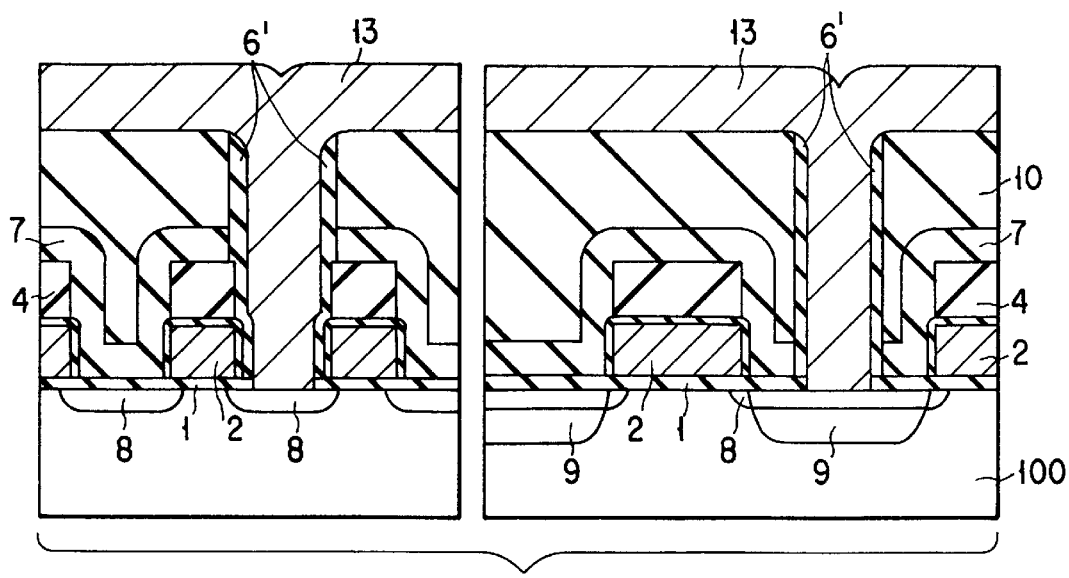
F I G. 12E

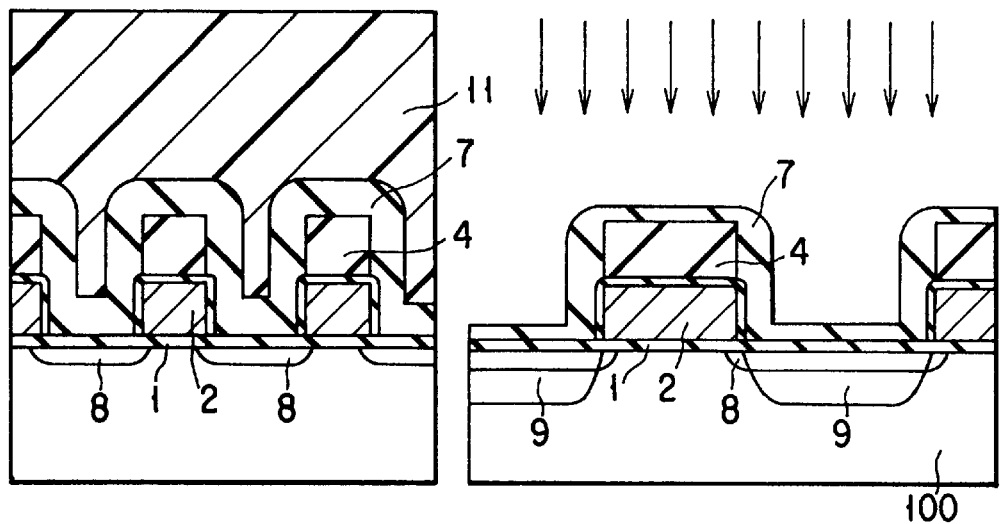
F I G. 14A
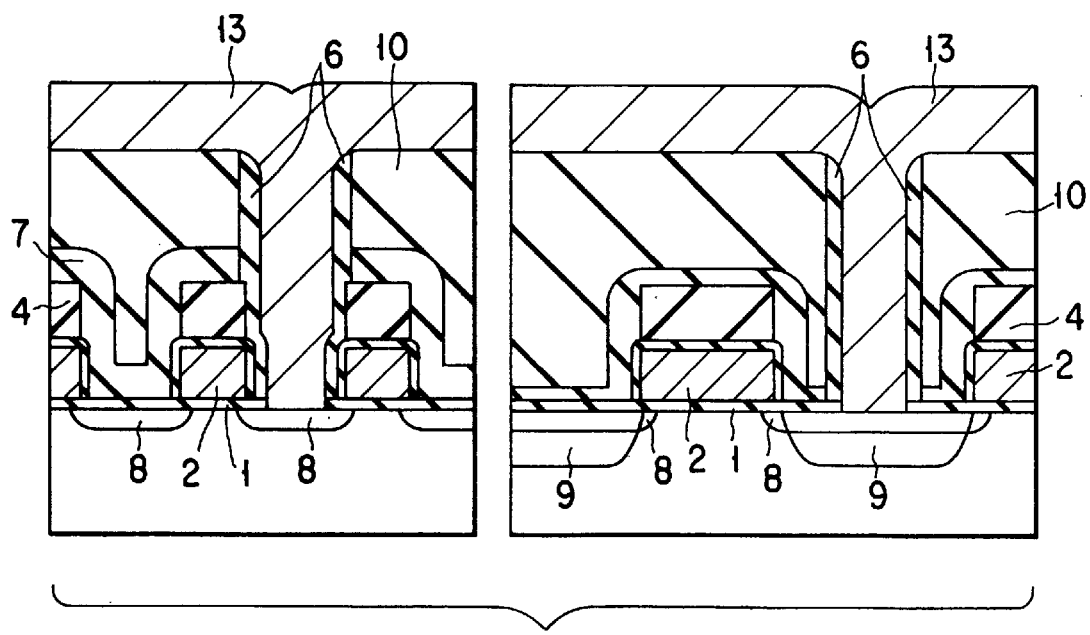
F I G. 14B

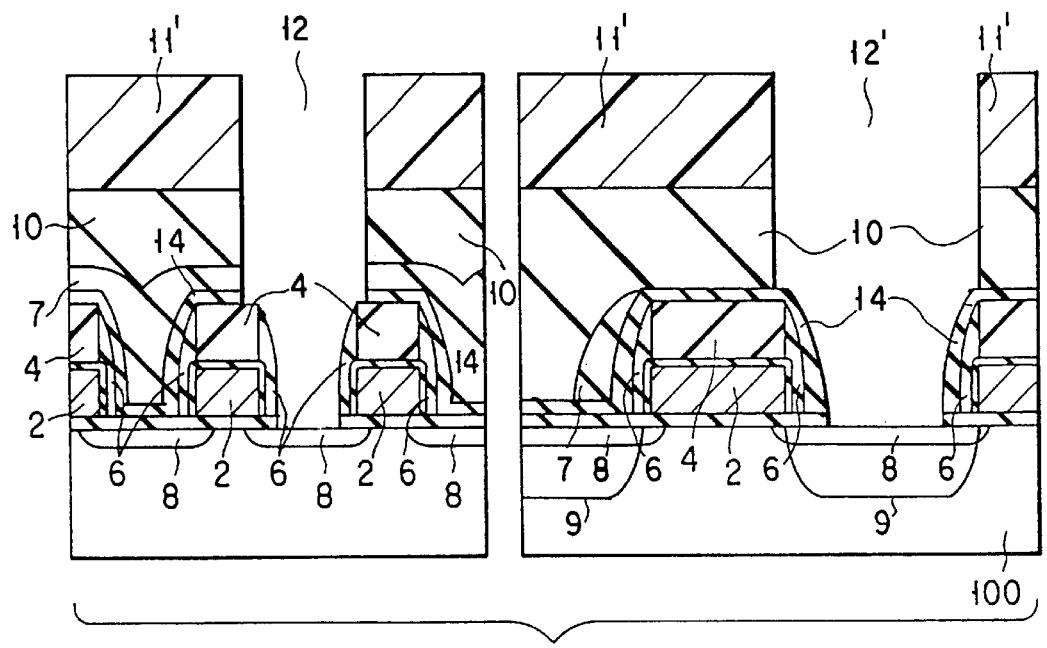
F I G. 17A
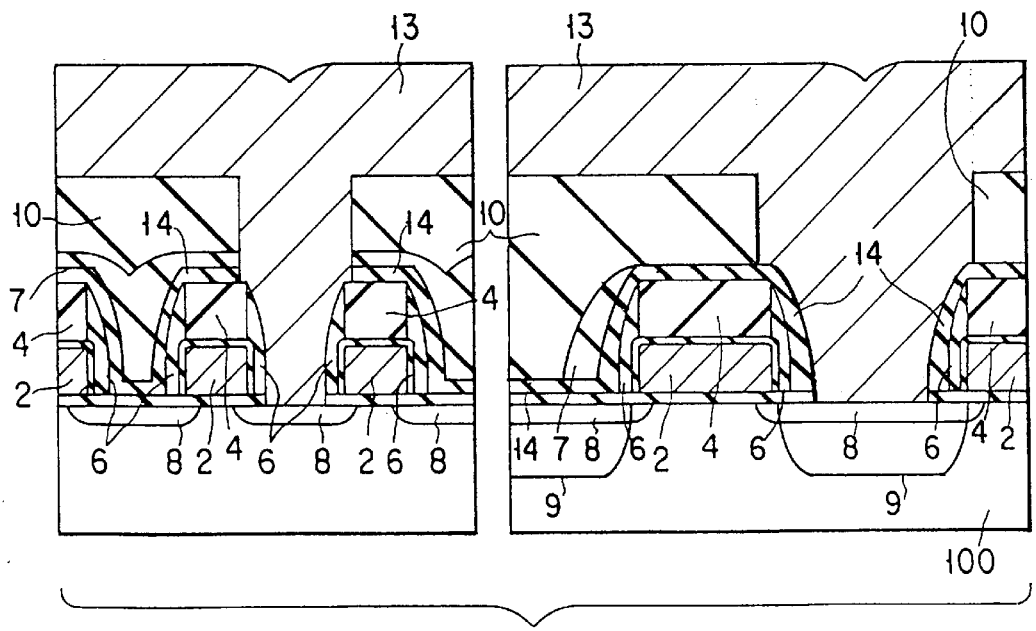
F I G. 17B

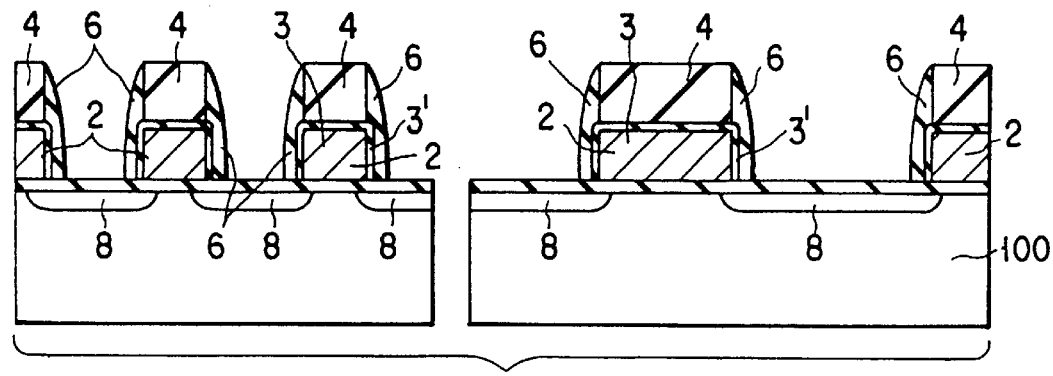
F I G. 18A
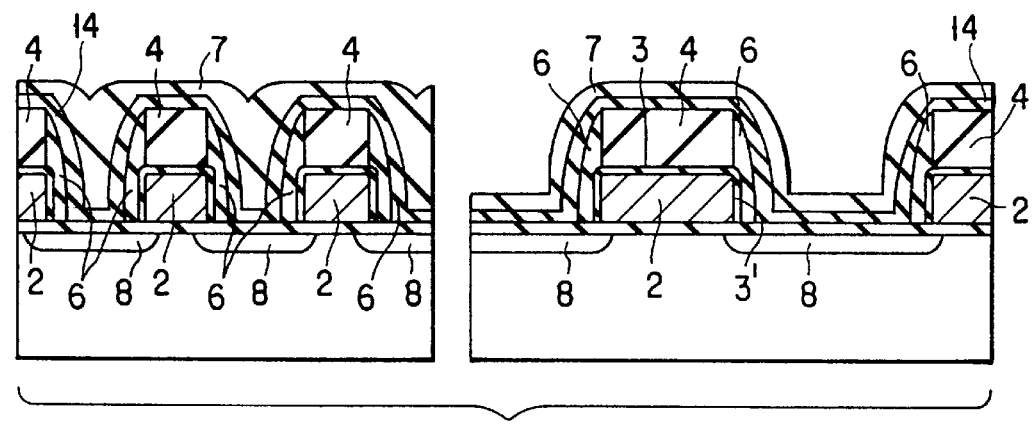
F I G. 18B
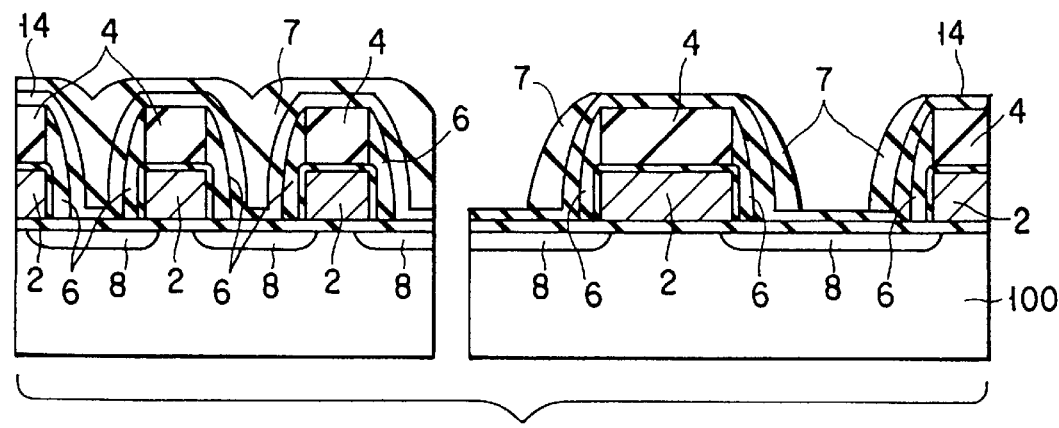
F I G. 18C

SEMICONDUCTOR APPARATUS FORMED BY SAC (SELF-ALIGNED CONTACT) METHOD AND MANUFACTURING METHOD THEREFOR

BACKGROUND OF THE INVENTION

The present invention relates to a densely integrated semiconductor apparatus formed by a SAC (Self-Aligned Contact) method and a manufacturing method therefor, and more particularly to a semiconductor apparatus, such as a DRAM, having fine MOS (Metal Oxide Semiconductor) transistors and a manufacturing method therefor.

The entire contents of Japanese Patent Application No. 8-158379 filed on Jun. 19, 1996 and Japanese Patent Application No. 9-158464 filed on Jun. 16, 1997 are incorporated herein by reference.

The degree of integration of a highly-integrated semiconductor apparatus represented by a DRAM (Dynamic Random Access Memory) having memory cells each of which is composed of one MOS transistor and one capacitor has been raised by reducing the minimum processing size. However, a variety of self-align technologies have been developed as technologies capable of forming fine devices without influence of an accuracy of aligning patterns in order to further raise the degree of integration. An example of the technologies above will now be described with reference to FIGS. 1A to 1D which is structured such that a contact hole for connecting a source/drain diffusion layer of a MOS transistor and a wiring layer of the same to each other is formed in a self-align manner with the gate electrode.

A gate insulator film 1, a gate electrode material 2, for example, poly crystal silicon, an oxide film 3 and an insulating film 4, such as a nitride film, are formed on a semiconductor substrate 100. Then, a lithography method and an anisotropic etching technique, such as RIE (Reactive Ion Etching) method, are employed to etch the insulating film 4, the oxide film 3 and the gate electrode material 2 so that a gate electrode is formed. Then, a sidewall oxide 3' is formed by, for example, thermal oxidation, and an ion implantation method is employed to add impurities, such as arsenic, to the substrate 100 so that a source/drain diffusion layer 8 is formed. FIG. 1A shows the cross section of a semiconductor apparatus in the foregoing state.

Then, an insulating film 6, such as a nitride film, is deposited to cover the formed gate electrode.

Then, an anisotropic etching technique, such as the RIE method, is employed to etch the insulating film 6 and the gate oxide film 1 to expose the substrate 100 and leave the insulating film 6 on the side surfaces of the gate electrode 2 and the insulating film 4. Then, an ion implantation method or the like is employed to add impurities, such as arsenic, to the substrate 100 so that a source/drain diffusion layer 9 is formed. FIG. 1C shows the cross section of a semiconductor apparatus in the foregoing state. The source/drain structure having a shape composed of the diffusion layers 8 and 9 is generally called as an "LDD structure" and formed for the purpose of improving the reliability of a transistor.

Moreover, an interlayer dielectric film 10 is deposited. Then, a resist film 11 is applied, and an opening is formed in the resist film 11 to include a contact hole region and overlapping the gate electrode 2. For example, an anisotropic technique, such as the RIE method, is employed to etch the interlayer dielectric film 10 to expose the substrate 100 in such a manner that the resist film 11 is used as a mask so that a contact hole 12 is formed. FIG. 1D shows the cross section of the semiconductor apparatus in the foregoing state.

Then, the resist film 11 is removed, a conductive material is deposited, and then a wiring layer to be connected to the diffusion layers 8 and 9 is formed.

When the contact hole 12 is formed, etching conditions are determined in such a manner that the speed, at which the interlayer dielectric film 10 is etched, is made to be higher than the speed, at which the insulating films 4 and 6 are etched. As a result, if the pattern of the contact hole 12 overlaps the gate electrode 2 as shown in FIG. 1D, etching of the insulating films 4 and 6 can be prevented. Therefore, a structure is realized in which the gate electrode 2 is covered with the insulating films 4 and 6. As a result, short circuit between the wiring layer (not shown) and the gate electrode 2 can be prevented. The foregoing technology capable of preventing short circuit between the wiring layer and the gate electrode 2 regardless of the pattern alignment accuracy between the pattern of the contact hole 12 and that of the gate electrode 2 is called a "self-align technology".

However, the contact hole 12 is, in a dense semiconductor apparatus, formed in a region between adjacent gate electrodes. Therefore, the recent trend of raising the density of the semiconductor apparatus results in the distance between the gate electrodes being shortened. As a result, there arises a problem in that the resistance of the contact portion is strengthened excessively because a satisfactorily large area cannot be provided for the contact hole.

A method for weakening the resistance of the contact portion is available in which the thickness of the side wall 6 is reduced. However, the conventional manufacturing method, in which ion implantation for forming the drain diffusion layer 9 is performed by using the side wall 6 as the mask, results in the drain diffusion layer 9 being deeply diffused to a position below the gate electrode 2 as shown in FIG. 2 if the thickness of the side wall 6 is reduced. As a result, the effective channel length L of the transistor is shortened unintentionally. Therefore, there arises a problem in that the operation of the transistor cannot easily be controlled.

As described above, when the contact hole is formed in the self-align manner with the gate electrode, a large area cannot be provided for the contact hole because of the trend of raising the density of the semiconductor apparatus. Thus, there arises a problem in that the resistance of the contact hole is strengthened excessively. If the thickness of the side wall is reduced in order to prevent strengthening of the resistance of the contact portion, the source/drain diffusion layer formed by using the side wall as the mask is deeply diffused in the direction of the gate length. As a result, there arises a problem in that the effective gate length is shortened and the controllability of the transistor deteriorates.

BRIEF SUMMARY OF THE INVENTION

An object of the present invention is to provide a method of manufacturing a highly integrated semiconductor apparatus having a fine transistor capable of reducing resistance of the contact between a wiring layer and a diffusion layer and exhibiting excellent controllability by providing a large area for a contact hole formed in a self-align manner with a gate electrode.

According to an aspect of the present invention, there is provided a method of manufacturing a semiconductor apparatus comprising the steps of: forming a gate electrode having a first insulating film laminated in the upper portion thereof on a gate insulating film formed on a semiconductor substrate; forming first diffusion layers on the semiconductor substrate by using the gate electrode as a mask; forming side insulating films on the side of the gate electrode; forming a second insulating film to cover the side insulating films; forming second diffusion layers on the semiconductor substrate by using the second insulating film on the side insulating film as a mask; forming an interlayer dielectric film over the semiconductor substrate and the gate electrode; selectively etching the interlayer dielectric film and the second insulating film to form an opening portion so as to expose the surface of the semiconductor substrate in the bottom portion of the opening portion; and forming a wiring layer connected to the exposed surface of the semiconductor substrate.

According to a second aspect of the present invention, there is provided a method of manufacturing a semiconductor apparatus comprising the steps of: forming a gate electrode having a first insulating film laminated in the upper portion thereof on a gate insulating film formed on a semiconductor substrate; forming first diffusion layers on the semiconductor substrate by using the gate electrode as a mask; forming a second insulating film on the side and upper surfaces of the first insulating film and the side surface of the gate electrode; forming second diffusion layers on the semiconductor substrate by using the second insulating film on the side wall of the gate electrode as a mask; forming an interlayer dielectric film over the semiconductor substrate; selectively etching the interlayer dielectric film and the second insulating film to form an opening portion in the gate electrode; forming a third insulating film on the side wall of the opening portion and the side wall of the gate electrode; and forming a conductive material in the opening portion.

According to the third aspect of the present invention, there is provided a method of manufacturing a semiconductor apparatus comprising the steps of: forming a gate electrode having a first insulating film laminated in the upper portion thereof on a gate insulating film formed on a semiconductor substrate; forming first diffusion layers on the semiconductor substrate by using the gate electrode as a mask; forming a first side insulating films on side walls of the gate electrode; forming a second insulating film to cover the first side insulating films forming second side insulating films on side walls of the gate electrode on the second insulating film; forming second diffusion layers on the semiconductor substrate by using the second insulating film on the first side insulating films as a mask; forming a interlayer dielectric film over the semiconductor substrate; selectively etching the interlayer dielectric film, the second insulating film and the second side insulating films to form an opening portion in the gate electrode; and forming a conductive material in the opening portion.

According to a fourth aspect of the present invention, there is provided a method of manufacturing a semiconductor apparatus comprising the steps of: forming a gate electrode having a first insulating film laminated in the upper portion thereof on first and second regions on a gate insulating film formed on a semiconductor substrate in such a manner that the interval between gate electrodes in the first region is shorter than that in the second region; forming first diffusion layers on the semiconductor substrate by using the gate electrode as a mask; forming a second insulating film to cover the gate electrode; forming second diffusion layers on the semiconductor substrate by using a portion of the second insulating film on the side insulating film which is formed on the side surface of the gate electrode as a mask; forming an interlayer dielectric film over the semiconductor substrate; selectively etching the interlayer dielectric film and the second insulating film in the first region to form a first opening portion in the gate electrode; selectively etching the interlayer dielectric film and the second insulating film in the second region to form a second opening portion in the gate electrode; and forming a conductive material in the first and second opening portions.

According to a fifth aspect of the present invention, there is provided a method of manufacturing a semiconductor apparatus comprising the steps of: forming a gate electrode having a first insulating film laminated in the upper portion thereof on first and second regions on a gate insulating film formed on a semiconductor substrate in such a manner that the interval between gate electrodes in the first region is shorter than that in the second region; forming first diffusion layers on the semiconductor substrate by using the gate electrode as a mask; forming first side insulating films on the side wall of the gate electrode; forming a second insulating film such that a space between gate electrodes on the first region is substantially plugged; forming second side insulating films on the second insulating film on the side wall of the gate electrode in the second region; forming second diffusion layers on the semiconductor substrate by using a portion of the second insulating film on the side insulating film in the side portion of the gate electrode as a mask; forming a interlayer dielectric film over the semiconductor substrate; selectively etching the interlayer dielectric film and the second insulating film in the first region to form a first opening portion in the gate electrode; selectively etching the interlayer dielectric film and the second insulating film in the second region to form a second opening portion in the gate electrode; and forming a conductive material in the first and second opening portions.

According to a sixth aspect of the present invention, there is provided a semiconductor apparatus comprising: a semiconductor substrate; a gate insulating film formed on the semiconductor substrate; first and second gate electrodes formed on the gate insulating film and respectively having first and second insulating films laminated thereon; side insulating films formed on the side walls of the first and second gate electrodes; a wiring layer formed between the first and second gate electrodes; a third insulating film for covering a predetermined portion on the first insulating film and the side insulating film opposite to the side wall of the first gate electrode adjacent to the wiring layer; a fourth insulating film for covering a predetermined portion on the second insulating film and the side insulating film opposite to the side wall of the second gate electrode adjacent to the wiring layer; a first diffusion layer formed on the two sides of a region which is formed below the first and second gate electrode and in which a channel will be formed, the first diffusion layer being formed on the surface of the semiconductor substrate; and a second diffusion layer having an end adjacent to the region in which the channel will be formed and located more apart from the region in which the channel will be formed than the end of the first diffusion layer adjacent to the region in which the channel will be formed, the second diffusion layer having a bottom portion which is deeper than the bottom portion of the first diffusion layer.

According to a seventh aspect of the present invention, there is provided a semiconductor apparatus comprising: a semiconductor substrate; first and second gate electrodes formed on the gate insulating film and respectively having first and second insulating films laminated thereon; first side insulating films formed on the side wall of the first gate electrode; second side insulating films formed on the side wall of the second gate electrode; a wiring layer formed between the first and second gate electrodes; a third insulating film for covering a predetermined portion on the first insulating film and a portion of the first side insulating films that is the side insulating film opposite to the side wall of the first gate electrode adjacent to the wiring layer; a fourth insulating film for covering a predetermined portion on the second insulating film and a portion of the second side insulating films that is the side insulating film opposite to the side wall of the second gate electrode adjacent to the wiring layer; third side insulating films formed on the third insulating film; fourth side insulating films formed on the fourth insulating film; a first diffusion layer formed on the two sides of a region which is formed below the first and second gate electrodes and in which a channel will be formed, the first diffusion layer being formed on the surface of the semiconductor substrate; and a second diffusion layer having an end adjacent to the region in which the channel will be formed and located more apart from the region in which the channel will be formed than the end of the first diffusion layer adjacent to the region in which the channel will be formed, the second diffusion layer having a bottom portion which is deeper than the bottom portion of the first diffusion layer.

According to a eighth aspect of the present invention, there is provided a semiconductor apparatus comprising: a semiconductor substrate having first and second regions; a gate insulating film formed on the semiconductor substrate; the first region on the semiconductor substrate comprising: first and second gate electrodes formed on the gate insulating film and respectively having first and second insulating films laminated thereon; a wiring layer formed between the first and second gate electrodes; a first insulating film for covering a predetermined portion on the first insulating film and the side wall of the first gate electrode opposite to the side wall adjacent to the wiring layer; a second insulating film for covering a predetermined portion on the second insulating film and the side wall of the second gate electrode opposite to the side wall adjacent to the wiring layer; a first interlayer dielectric film formed on the first insulating film; a second interlayer dielectric film formed on the second insulating film; a third insulating film formed between the first interlayer dielectric film, the first insulating film and the first gate electrode and the wiring layer; a fourth insulating film formed between the second interlayer dielectric film, the second insulating film and the second gate electrode and the wiring layer; and a first diffusion layer formed on the two sides of a region which is formed below the first and second gate electrodes and in which a channel will be formed, the first diffusion layer being formed on the surface of the semiconductor substrate; the second region on the semiconductor substrate comprising: third and fourth gate electrodes formed on the gate insulating film such that the third and fourth gate electrode are formed on the two sides of the wiring layer and the distance between gate electrodes is longer than that in the first region, the third and fourth gate electrodes respectively having fifth and sixth insulating films laminated thereon; a seventh insulating film for covering the third gate electrode; an eighth insulating film for covering the fourth gate electrode; a third interlayer dielectric film formed on the seventh insulating film; a fourth interlayer dielectric film formed on the eighth insulating film; a ninth insulating film formed between the third interlayer dielectric film and the seventh insulating film and the wiring layer; a tenth insulating film formed between the fourth interlayer dielectric film and the eighth insulating film and the wiring layer; a second diffusion layer formed on the two sides of a region which is formed below the third and fourth gate electrodes and in which a channel will be formed, the second diffusion layer being formed on the surface of the semiconductor substrate; and a third diffusion layer having an end adjacent to the region in which the channel will be formed and located more apart from the region in which the channel will be formed than the end of the second diffusion layer adjacent to the region in which the channel will be formed, the third diffusion layer having a bottom portion which is deeper than the bottom portion of the first diffusion layer.

According to a ninth aspect of the present invention, there is provided a semiconductor apparatus comprising: a semiconductor substrate having first and second regions; and a gate insulating film formed on the semiconductor substrate, the first region on the semiconductor substrate comprising: first and second gate electrodes formed on the gate insulating film and respectively having first and second insulating films laminated thereon; a plurality of first side insulating films formed on the side walls of the first and second gate electrodes; a wiring layer formed between the first and second gate electrodes; a third insulating film for covering a predetermined portion on the first insulating film and a portion of the plural first side insulating films which is the side insulating film on the first gate electrode opposite to the side wall adjacent to the wiring layer; a fourth insulating film for covering a predetermined portion on the second insulating film and a portion of the plural first side insulating films which is the side insulating film on the second gate electrode opposite to the side wall adjacent to the wiring layer; and a first diffusion layer formed on the two sides of a region which is formed below the first and second gate electrode and in which a channel will be formed, the first diffusion layer being formed on the surface of the semiconductor substrate, the second region of the semiconductor substrate comprising: third and fourth gate electrodes formed on the gate insulating film such that the third and fourth gate electrodes are formed on the two sides of the wiring layer and the distance between the gate electrodes is longer than that in the first region, the third and fourth gate electrodes respectively having fifth and sixth insulating films laminated thereon; second side insulating films formed on the side wall of the third gate electrode; third side insulating films formed on the side wall of the second gate electrode; seventh insulating film for covering a predetermined portion on the fifth insulating film and a portion of the second side insulating film which is the side insulating film on the side wall of the third gate electrode opposite to the side wall of the third gate electrode adjacent to the wiring layer; eighth insulating film for covering a predetermined portion on the sixth insulating film and a portion of the third side insulating film which is the side insulating film on the side wall of the fourth gate electrode opposite to the side wall of the fourth gate electrode adjacent to the wiring layer; fourth side insulating films formed on the seventh insulating film; fifth side insulating films formed on the eighth insulating film; a second diffusion layer formed on the two sides of a region which is formed below the third and fourth gate electrodes and in which a channel will be formed, the second diffusion layer being formed on the surface of the semiconductor substrate; and a third diffusion layer having an end adjacent to the region in which the channel will be formed and located more apart from the region in which the channel will be formed than the end of the first diffusion layer adjacent to the region in which the channel will be formed, the third diffusion layer having a bottom portion which is deeper than the bottom portion of the second diffusion layer.

According to the present invention structured as described above, there is provided a method of manufacturing a highly integrated semiconductor apparatus having a fine transistor capable of reducing resistance of the contact portion between a wiring layer and a diffusion layer and exhibiting excellent controllability by providing a large area for a contact hole formed in a self-align manner with a gate electrode.

By applying the present invention structured as described above to a DRAM, the effective channel length of fine transistors forming the peripheral circuit or the like can be maintained. Moreover, a satisfactory large area can be provided for a contact hole even in a region, such as a memory cell, in which the pattern density is high.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 5A to 5D are cross sectional views showing the structure of a semiconductor apparatus in each step of a method of manufacturing a semiconductor apparatus according to a second embodiment of the present invention;

FIGS. 6A to 6C are cross sectional views showing the structure of a semiconductor apparatus in each step of a method of manufacturing a semiconductor apparatus according to a third embodiment of the present invention;

FIGS. 7A to 7E are cross sectional views showing the structure of a semiconductor apparatus in each step of a method of manufacturing a semiconductor apparatus according to a fourth embodiment of the present invention;

FIGS. 12A to 12E are cross sectional views showing the structure of a semiconductor apparatus in each step of a method of manufacturing a semiconductor apparatus according to a ninth embodiment of the present invention;

FIGS. 14A and 14B are cross sectional views showing the structure of a semiconductor apparatus in each step of a method of manufacturing a semiconductor apparatus according to en eleventh embodiment of the present invention;

FIGS. 17A and 17B are cross sectional views showing the structure of a semiconductor apparatus in each step of a method of manufacturing a semiconductor apparatus according to a fourteenth embodiment of the present invention;

FIGS. 18A to 18E are cross sectional views showing the structure of a semiconductor apparatus in each step of a method of manufacturing a semiconductor apparatus according to a fifteenth embodiment of the present invention.

DETAILED DESCRIPTION OF THE INVENTION

Figure 1A:
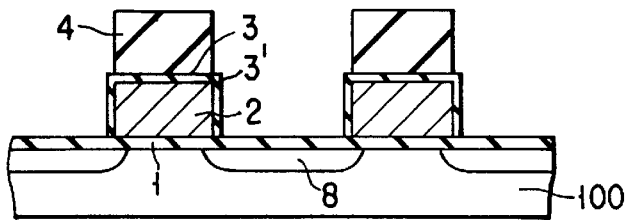
FIGS. 1A to 1D are cross sectional views showing the structure of a semiconductor apparatus in each step of a conventional method of manufacturing a semiconductor apparatus.
Figure 1B:
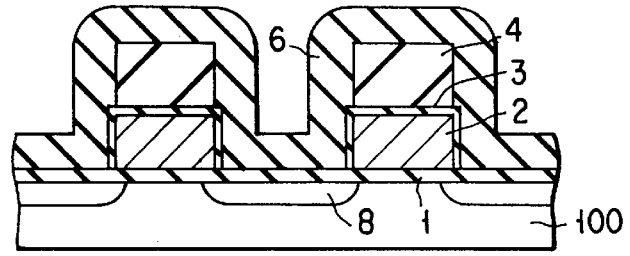
Figure 1C:
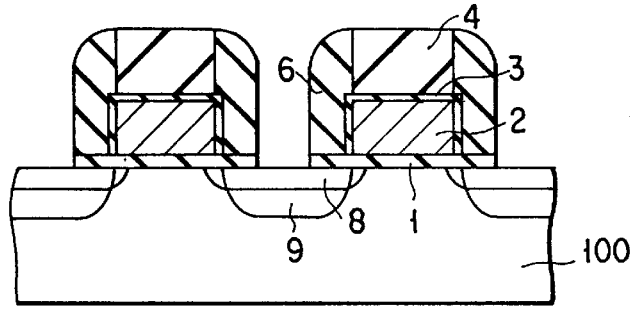
Figure 1D:
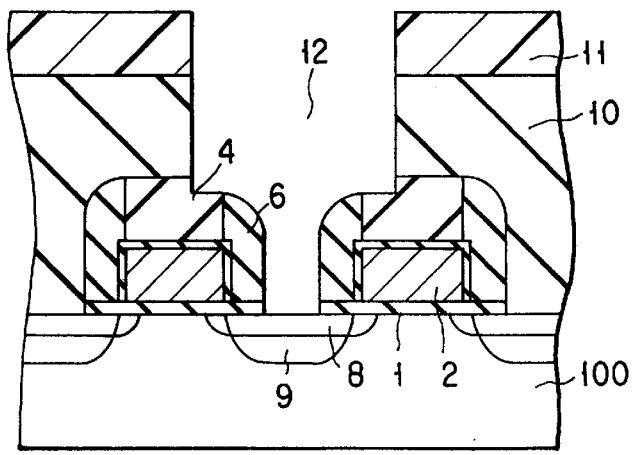
Figure 2:
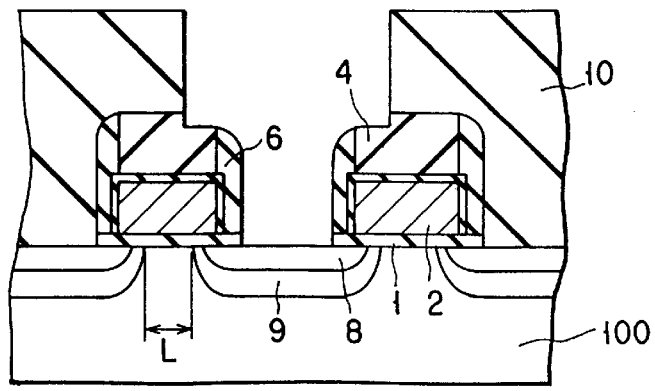
FIG. 2 is a cross sectional view showing the structure of the conventional semiconductor apparatus.

Referring to the drawings, embodiments of the present invention will now be described. In first to eighth embodiments, a method of manufacturing a semiconductor apparatus relating to peripheral circuit portions of the semiconductor apparatus represented by a DRAM will be described. In ninth to sixteenth embodiments, the method of manufacturing the semiconductor apparatus will be described such that the peripheral circuit portions of the semiconductor apparatus and the cell portions are contrasted with each other. The same elements are given the same reference numerals and they are omitted from detailed descriptions.

The first embodiment of the present invention will now be described. FIGS. 3A to 3E are cross sectional views showing a method of manufacturing the semiconductor apparatus according to a first embodiment of the present invention.

A gate insulating film 1, such as an oxide film ($SiO_2$), is formed on a substrate 100 which is, for example, a p-type silicon substrate, by, for example, a thermal oxidation method. A gate electrode material, for example, poly silicon film, is deposited on the gate insulating film 1. Then, impurities, for example, phosphorus or arsenic, are added to the gate electrode material by ion implantation method or the like, if necessary. Then, an oxide film 3 is formed on the gate electrode material by a thermal oxidation method or the like, and then an insulating film 4, such as a nitride film, is deposited on the oxide film 3.

Then, a lithography method or the like and an anisotropic etching technique, such as a RIE method, are employed to etch the insulating film 4, the oxide film 3 and the gate electrode material so that a gate electrode 2 is formed. Then, a thermal oxidation method or the like is employed to form a sidewall oxide 3' on the side surface of the gate electrode 2. Then, an ion implantation method or the like is employed to add impurities, such as arsenic, to the substrate 100 so that source/drain diffusion layer 8 is formed.

Figure 3A:
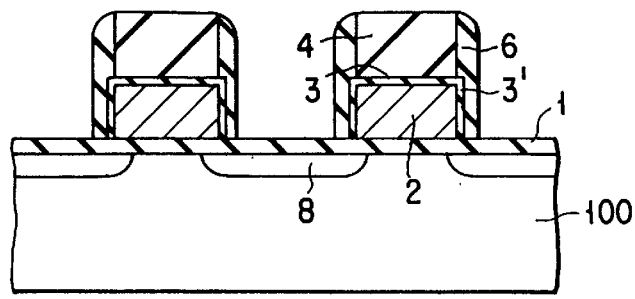
FIGS. 3A to 3E are cross sectional views showing the structure of a semiconductor apparatus in each step of a method of manufacturing a semiconductor apparatus according to a first embodiment of the present invention.

Then, an insulating film 6, such as a nitride film, is deposited to cover the formed gate electrode 2. Then, an anisotropic etching technique, for example, the RIE method, is employed to remove the insulating film 6 on the insulating film 4 and the gate insulating film 1 but the insulating film 6 is left on the side wall of the gate electrode 2 and the insulating film 4 so that a side wall 6 is formed. FIG. 3A shows a cross section of the semiconductor apparatus in the foregoing state. The foregoing steps are the same as those of the conventional method.

Figure 3B:
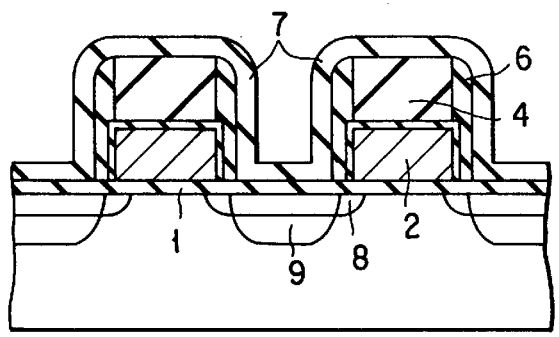

Then, a step different from the conventional method is performed such that an insulating layer 7, such as a BPSG (Borophosphosilicate glass) film, is deposited to have a thickness of, for example, about 50 nm. Then, impurities, such as arsenic, are ion-implanted through the insulating layer 7 so as to be added to the substrate 100. Then, heat treatment is performed as required so that a diffusion layer 9 is formed. FIG. 3B shows the cross section of the semiconductor apparatus in the foregoing state. In the first embodiment, the insulating layer 7 is deposited to have a thickness which does not plug up the space between gates.

When the ion implantation is performed, the side wall portion of the gate electrode 2 serves as a mask because the thickness of the insulating layer 7 in the vertical direction is large. Thus, impurities are ion-implanted into a region apart from the gate electrode 2 by a certain distance. Since the foregoing distance is generally in substantially proportion to the thickness of the deposited insulating layer 7, adequate determination of the thickness of the insulating layer 7 enables the distance d from the end of the diffusion layer 9 to the gate electrode 2 to be adjusted. In order to cause impurities to pass through the insulating layer 7 to reach the substrate 100, the accelerating voltage for implanting ions must be set arbitrarily to correspond to the thickness of the insulating layer 7.

Figure 3C:
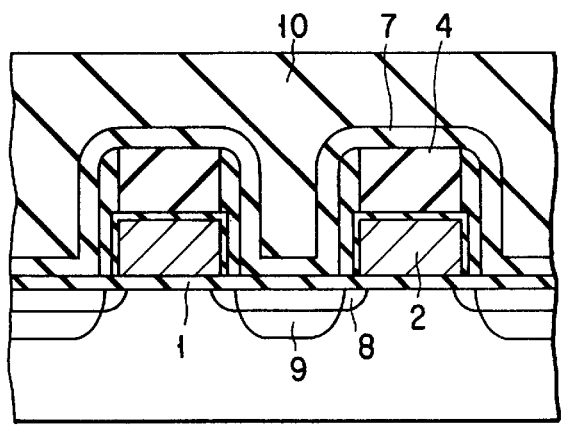

Then, an interlayer dielectric film 10, such as a BPSG film, is deposited, and heat treatment is performed if necessary to flatten the interlayer dielectric film 10. FIG. 3C shows the cross section of the semiconductor apparatus in the foregoing state. A thermal diffusion process for forming the diffusion layer 9 may be performed simultaneously with, for example, the flattening process.

Figure 3D:
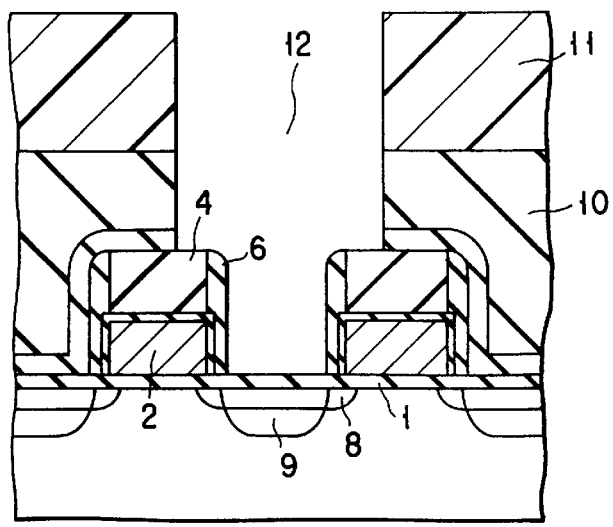

Then, a resist film 11 is applied, and then an opening is formed in the resist film 11. An anisotropic etching technique, such as the RIE method, is employed to etch the interlayer dielectric film 10 and the insulating layer 7 such that the resist film 11 is used as the mask so that a contact hole 12 is formed. FIG. 3D shows the cross section of the semiconductor apparatus in the foregoing state.

At this time, the etching condition is determined such that the speed at which the interlayer dielectric film 10 and the insulating layer 7 are etched is higher than that at which the insulating film 4 and the side wall 6 are etched. As a result, the contact hole 12 can be formed in a self-align manner with the gate electrode 2, as shown in FIG. 3D. Moreover, the etching condition is determined in such a manner that the speed at which the interlayer dielectric film 10 and the insulating layer 7 are etched is higher than that at which the gate insulating film 1 is etched. As a result, a problem in that the substrate 100 is etched and damaged and thus, for example, leak currents are increased can be prevented. As a material for the insulating film capable of satisfying the above-mentioned conditions, nitride films may be employed as the insulating film 4 and the side wall 6 and BPSG films may be employed as the insulating layer 7 and the interlayer dielectric film 10.

When the insulating layer 7 and the interlayer dielectric film 10 are made of the same insulating material, such as BPSG, the etching conditions can easily be determined.

Figure 3E:
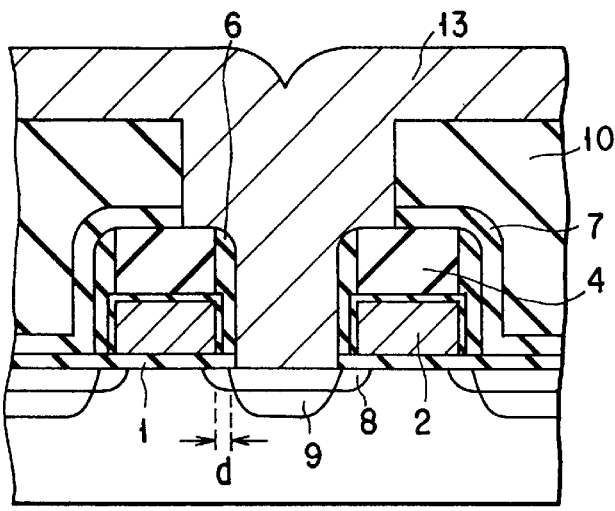

Then, wet etching is performed by using $NH_4F$ or the like so as to remove a portion of the gate oxide film 1 in the region of the contact hole 12 so that the substrate 100 is exposed. Then, a conductive material, such as tungsten, is employed so that a wiring layer 13 is formed. Thus, a semiconductor apparatus structured as shown in FIG. 3E is manufactured.

As described above, this embodiment is characterized in that the insulating layer 7 is deposited prior to forming the source/drain diffusion layer 9; and the insulating layer 7 is not processed but impurities are ion-implanted into the substrate 100 through the insulating layer 7. Another characteristic lies in that the insulating layer 7 which has been used as the mask for implanting ions is etched together with the interlayer dielectric film 10 when the contact hole 12 is formed so that the portion of the insulating layer 7 in the region of the contact hole 12 is removed.

As described above, since the thickness of the insulating layer 7 is determined properly in this embodiment, the distance d from the diffusion layer 9 to the gate electrode 2 is adjusted so that a satisfactory long effective channel length of a transistor is maintained. Thus, deterioration in the performance of the transistor can be prevented.

Since an area for the contact hole 12 can be maintained by removing the portion of the insulating layer 7 in the region of the contact hole 12 prior to forming the contact hole 12, strengthening of the contact resistance can be prevented.

The conventional method has been arranged such that the ion implantation is performed such that the side wall 6 formed on the side wall of the gate electrode 2 is used as the mask; and the side wall 6 is not removed. Therefore, if the thickness of the side wall 6 is enlarged to maintain the effective channel length, the area of the contact hole 12 is reduced and the contact resistance is strengthened. If the thickness of the side wall 6 is reduced in order to maintain the area for the contact hole 12, the diffusion layer 9 is deeply diffused to a position below the gate electrode 2. Thus, there arises a problem in that the effective channel length is shortened. However, the manufacturing method according to this embodiment having the step of removing the insulating layer 7, which is used as the mask when ions are implanted, when the contact hole is formed, does not reduce the area for the contact hole even if the insulating layer 7 is formed thickly to maintain the effective channel length. As described above, a structure capable of sufficiently maintaining an effective channel length and the contact area can be realized.

If the insulating layer 7 and the interlayer dielectric film 10 are made of the same material, etching can be performed when the contact hole 12 is formed similarly to the case where a single-layer interlayer dielectric film 10 film is formed. Therefore, the etching conditions can easily be determined. Thus, the manufacturing process is not complicated as compared with the conventional manufacturing method.

The material and etching conditions are determined with which the etching speed of the insulating layer 7 and the interlayer dielectric film 10 is higher than that of the insulating film 4, the side wall 6 and the gate insulating film 1 when the contact hole 12 is formed. As a result, the fact that the insulating film 4 on the gate electrode 2 or the side wall 6 formed on the side wall of the gate electrode 2 is etched and thus the gate electrode 2 and the wiring layer 13 are short-circuited each other can be prevented. Moreover, the substrate 100 is not damaged during the etching operation. Thus, a problem in that leak currents are increased can be prevented. The insulating layer 7 and the interlayer dielectric film 10 are not limited to the BPSG film. For example, a PSG (Phosphosilicate Glass) film or a BSG film may be employed.

In this embodiment, etching for removing the insulating layer 7 on the substrate 100 and leaving the insulating layer 7 in only the side wall portion of the gate electrode 2 is not performed after the insulating layer 7 has been deposited which is used as the mask when ions are implanted. Therefore, overetching can be prevented so that etching of the gate insulating film 1 causing the substrate 100 to be exposed can be prevented. Moreover, etching of the substrate 100 can be prevented and thus the same can be protected from damage. As a result, increase in the leak current owning to the damage of the substrate 100 can be prevented.

In order to maintain the effective channel length and the area of the contact hole, etching may be performed in such a manner that the insulating layer 7 is left on the side wall of the gate electrode 2 to serve as the mask when ion implantation is performed; and then the insulating layer 7 is removed after ions have been implanted. Since the thickness of the gate insulating film 1 is reduced because of overetching, the probability of exposure of the substrate 100 is raised in this case.

On the other hand, this embodiment has the structure such that etching for leaving the insulating layer 7 on the side wall of the gate electrode 2 and removing the insulating layer 7 on the gate insulating film 1 is not performed. Therefore, the substrate 100 can be protected from being damaged to an extent similarly to that experienced with the conventional method.

Since etching for leaving the insulating layer 7 serving as the mask when ions are implanted on only the side wall portion of the gate electrode 2 is not performed in this embodiment, the insulating layer 7 deposited on the insulating film 4 on the gate electrode 2 is not etched. Therefore, the exposure of the insulating film 4 attributable to etching above, reduction in the thickness of the insulating film 4 attributable to overetching and damage owning to etching can be prevented. As a result, the insulating film 4 can be protected from damage to an extent similarly to that experienced with the conventional method. Thus, the insulating characteristic of the insulating film 4 can be maintained and thus short circuit between the gate electrode 2 and the wiring layer 13 can be prevented.

Since the conventional manufacturing method has been structured such that the insulating film 6 is etched to form the side wall 6 serving as the mask when ions are implanted, the width of the side wall 6 has been affected by dispersion in the amount of etching of the insulating film 6. Therefore, if the diffusion of the diffusion layer 9 is restricted attributable to, for example, lowering of the thermal treatment temperature level, there is a possibility that the distance d from the diffusion layer 9 to the gate electrode 2 cannot be controlled as desired.

However, this embodiment is structured such that the mask for use in implanting ions is not formed by etching the insulating layer 7. The thickness of the insulating film which is formed on the side wall of the gate electrode 2 is affected by only the thickness of the deposited film and therefore it is not affected by the dispersion in the amount of etching. As a result, the diffusion layer 9 can be formed in a self-align manner with the gate electrode 2 with a satisfactory controllability. Thus, transistors free from considerable dispersion and having satisfactory performance can be manufactured.

If the impurities for forming the diffusion layer 9 have the same type of conductance as that of the source/drain diffusion layer 8, they are not required to be the same type. The density of the diffusion layer 9 may be determined arbitrarily to be adaptable to the performance of the transistor. In order to restrict the short channel effect of the transistor, it is preferable that the depth for which the source/drain diffusion layer 8 and the substrate 100 are joined to each other be minimized. To weaken the joint resistance, it is preferable that the depth for which the diffusion layer 9 and the substrate 100 are joined be enlarged. Therefore, it is generally preferable that the joint depth of the diffusion layer 9 be larger than the joint depth of the source/drain diffusion layer 8.

In order to prevent lateral diffusion of the diffusion layer 9 which shortens the effective channel length of the transistor, it is preferable that the end of the diffusion layer 9 be on the outside of the channel region than the end of the source/drain diffusion layer 8. For example, it is preferable that the diffusion layer 9 be formed on only the outside of the side wall 6. However, as shown in FIG. 4B, the diffusion layer 9 may be formed onto the inside portion of the insulating film 6 and thus the diffusion layer 9 and the side wall 6 may overlap.

Figure 4A:
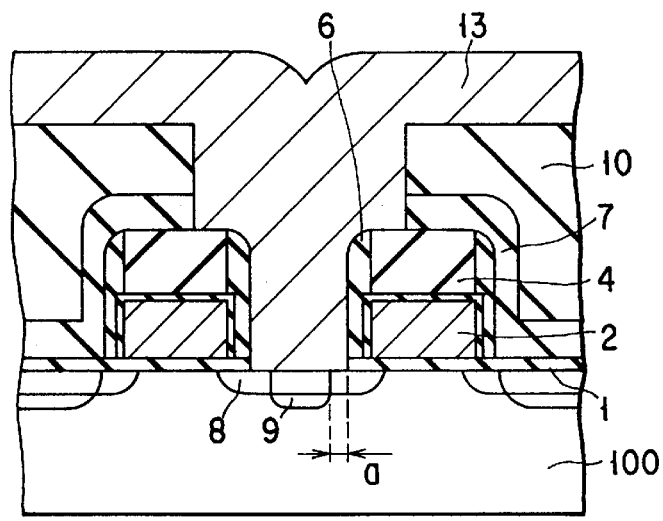
FIGS. 4A and 4B are cross sectional views showing a semiconductor apparatus manufactured by a method of manufacturing a semiconductor apparatus according to the first embodiment shown in FIGS. 3A to 3E.
Figure 4B:
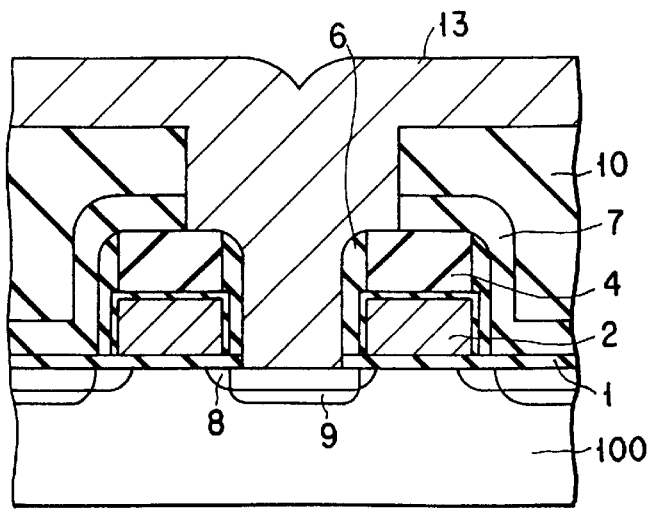

If the end of the diffusion layer 9 is formed on the outside of the side wall 6 as shown in FIG. 4A, the distance a from the end of the diffusion layer 9 to the end of the side wall 6 is called as an "offset quantity". The offset quantity depends upon the diffusion depth of the diffusion layer determined in accordance with the type of impurities, the depth of ion implantation, the temperature and time of the thermal process, the thickness of the insulating layer 7 which is the mask when ions are injected and the thickness of the side wall 6.

A second embodiment of the present invention will now be described with reference to FIGS. 5A to 5D.

In the second embodiment, the offset quantity a between the diffusion layer 9 and the side wall 6 and the joint depth with the diffusion layer 9 may be set individually.

Similarly to the first embodiment, the gate electrode 2 is processed so that the diffusion layer 8 is formed, and then the insulating layer 7 is deposited to have a required thickness. A similar process to that according to the first embodiment is performed until the insulating layer 7 is deposited. FIG. 5A shows the cross section of the semiconductor apparatus in the foregoing state.

Then, a process different from the first embodiment is performed such that an anisotropic etching technique, such as the RIE method, is employed to etch the insulating layer 7 to reduce the thickness of the insulating layer 7 on the substrate 100. Then, ion implantation or the like is performed so that impurities, such as arsenic, are added to the substrate 100. Then, similarly to the first embodiment, a proper thermal process is performed so that the source/drain diffusion layer 9 is formed. FIG. 5B shows a cross section of the semiconductor apparatus in the foregoing state.

Similarly to the first embodiment, the interlayer dielectric film 10, the contact hole 12 and the wiring layer 13 are formed so that the semiconductor apparatus having a structure as shown in FIG. 5C is manufactured.

As described above, the second embodiment has the structure arranged such that the anisotropic technology is employed to etch the insulating layer 7 prior to implanting ions for forming the source/drain diffusion layer 9 so that the thickness of the insulating layer 7 on the gate insulating film 1 is reduced. As a result, the necessity of raising the acceleration voltage for implanting ions can be eliminated to easily implant ions into deep region of the substrate 100. In general, if the diffusion layer 9 is formed deeply, lateral diffusion of the diffusion layer 9 takes place considerably. Therefore, if the diffusion layer 9 is attempted to be formed deeply, it is preferable that the thickness of the insulating layer 7 be enlarged to prevent shortening of the effective channel length of the transistor. However, the first embodiment is arranged such that the insulating layer 7 is not processed but impurities are ion-implanted into the substrate 100 through the insulating layer 7. Therefore, if the thickness of the insulating layer 7 is enlarged, ions must be implanted at highly accelerated voltage in order to form a deep diffusion layer. However, this embodiment having the structure such that the insulating layer 7 is etched to reduce the thickness of the insulating layer 7 on the substrate 100 is able to easily implant ions into the deep position. Since the anisotropic etching technology is employed, reduction in the thickness of the insulating layer 7 left on the side wall portion of the gate electrode 2 can be prevented. As described above, this embodiment is able to reduce the insulating layer 7 on the substrate 100 while leaving the insulating layer 7, which has a large thickness, on the side wall portion of the gate electrode 2. Therefore, the diffusion layer 9 is able to have a required depth and offset quantity. That is, the depth of the diffusion layer 9 and the offset quantity d with respect to the gate electrode can be determined independently so that the diffusion layer 9 is formed easily.

The thickness of the insulating layer 7 which is left on the gate insulating film 1 after etching has been performed is determined in consideration of the ion implantation depth and accelerated voltage which can be used. That is, if ion implantation is performed deeply, or if the accelerated voltage, which can be used, is low, the residual film thickness must be reduced. The amount of etching of the insulating layer 7 is the difference between the thickness of the residual film and the thickness of the deposited film.

Since the insulating layer 7 is left on the gate insulating film 1 as shown in FIG. 5B, exposure of the substrate 100 attributable to etching of the gate insulating film 1 and damage of the substrate 100 can be prevented.

The insulating layer 7 may be left on only the side wall portion of the gate electrode 2 and the overall portion of the insulating layer 7 on the gate insulating film 1 may be removed by etching, as shown in FIG. 5D. In this case, it is preferable that the material of the film and the etching conditions be determined to make the etching speed of the insulating layer 7 to be higher than the etching speed of the gate insulating film 1 in order to prevent damage of the substrate 100.

To further reliably prevent short circuit between the gate electrode 2 and the wiring layer 13, a method may be employed in which a side wall 6' is formed on the side wall of the contact hole 12 after the contact hole 12 has been formed. The foregoing method will now be described as a third embodiment of the present invention.

The third embodiment will now be described with reference to FIGS. 6A to 6C.

A process similar to that according to the first embodiment is performed until the contact hole 12 is formed. FIG. 6A shows a state similar to that shown in FIG. 3D.

Then, the resist film 11 is removed. Then, a process different from that according to the first embodiment is performed such that the side wall 6', for example, a nitride film, is formed on the overall surface. An anisotropic etching technique, such as the RIE method, is employed to remove the side wall 6' on the gate insulating film 1 in the region of the contact hole 12 to expose the gate insulating film 1. Then, the side wall 6' is left on the side wall of the gate electrode 2, that of the insulating film 4 and that of the interlayer dielectric film 10 so that the side wall 6' is formed. FIG. 6B shows the cross section of the semiconductor apparatus in the foregoing state. At this time, it is preferable that the etching conditions be determined to make the etching speed of the side wall 6' to be higher than the etching speed of the gate insulating film 1 similarly to the case where the contact hole 12 is formed in order to prevent damage of the substrate 100. The side wall 6' may be, for example, a nitride film similarly to the insulating film 4.

Then, a process similar to that according to the first embodiment is performed such that the gate insulating film 1 in the region of the contact hole 12 is removed so that the substrate 100 is exposed and the wiring layer 13 is formed. FIG. 6C shows the cross section of the semiconductor apparatus in the foregoing state.

As described above, this embodiment is characterized in that the contact hole 12 is formed; and then the side wall 6' is formed on the side wall of the formed contact hole 12. In the first embodiment or the second embodiment, the side wall of the interlayer dielectric film 10 or the side wall 6 can be damaged when the contact hole 12 is opened. However, the third embodiment has the structure such that the damaged side surface of the interlayer dielectric film 10 or the side wall 6 is covered with the side wall 6'. Thus, the insulating characteristic can furthermore be improved.

In the third embodiment, the side wall 6 and the side wall 6' are formed on the side wall of the gate electrode 2. Therefore, it is preferable that the thickness of the side wall 6 or the side wall 6' be reduced in order to provide a satisfactorily large area for the contact hole 12.

A fourth embodiment of the present invention will now be described with reference to FIGS. 7A to 7E.

The fourth embodiment has a structure such that the side wall 6 is not formed and short circuit between the gate electrode 2 and the wiring layer 13 is prevented by only the side wall 6' formed on the side wall of the contact hole 12 after the contact hole 12 has been formed.

Figure 7A:
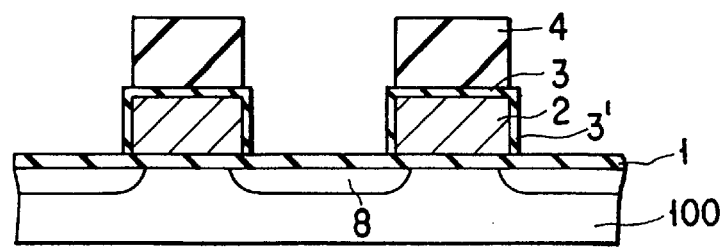
Figure 7B:
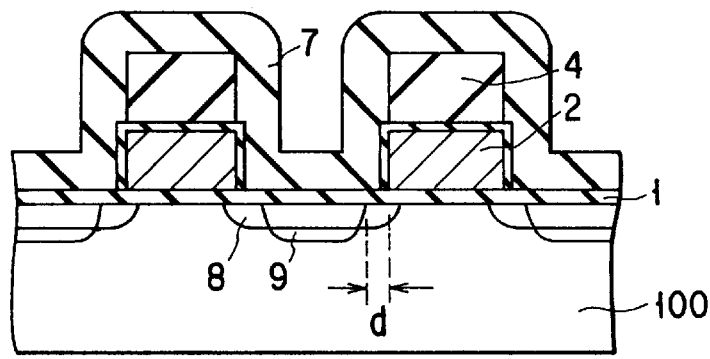

A process similar to that according to the third embodiment is performed until the gate electrode 2 is formed and the diffusion layer 8 is formed. FIG. 7A shows the cross section of the semiconductor apparatus in the foregoing state. Then, a process different from that according to the third embodiment is performed such that the side wall is not formed but the insulating layer 7 made of, for example, BPSG, is deposited to have a thickness of about 50 nm. Then, similarly to the third embodiment, impurities, for example, arsenic, are ion-implanted into the substrate 100 through the insulating layer 7 on the gate insulating film 1. Then, proper heat treatment is performed so that the diffusion layer 9 is formed. FIG. 7B shows the cross section of the semiconductor apparatus in the foregoing state. Prior to performing ion implantation for forming the diffusion layer 9, the anisotropic etching technology is used similarly to the second embodiment to form the insulating layer 7 having a small thickness.

Figure 7C:
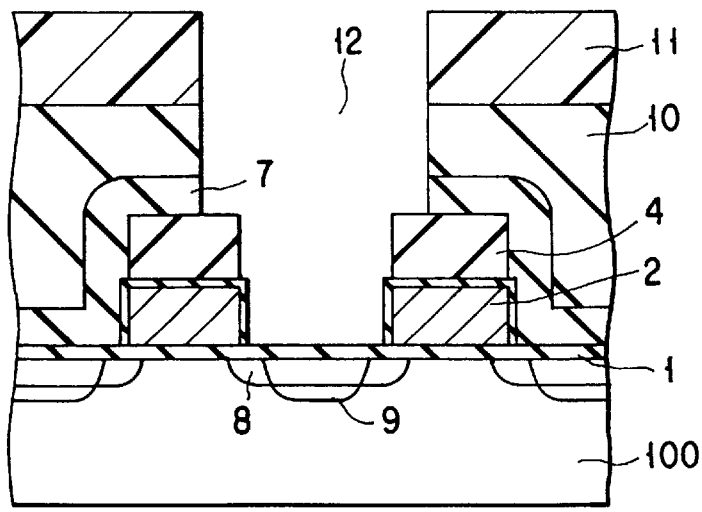

Then, similarly to the third embodiment, the interlayer dielectric film 10 is formed on the overall surface. Then, the resist film 11 having a contact hole region opened therein is formed. The resist film 11 is used as the mask to etch the interlayer dielectric film 10 and the insulating layer 7 by using, for example, the anisotropic etching technology so that the contact hole 12 is formed. FIG. 7C shows the cross section of the semiconductor apparatus in the foregoing state. At this time, the etching conditions are determined to make the etching speed of the interlayer dielectric film 10 and the insulating layer 7 to be higher than the etching speed of the insulating film 4 so that the contact hole 12 is formed in the self-align manner with respect to the gate electrode 2. By determining the etching conditions to make the etching speed of the interlayer dielectric film 10 and the insulating layer 7 to be higher than the etching speed of the gate insulating film 1, etching of the substrate 100 and damage of the same causing the leak current to be increased can be prevented. As a material for the insulating film 4 capable of satisfying the above-mentioned conditions, a nitride film or the like may be employed and, for example, BPSG films may be employed as the insulating layer 7 and the interlayer dielectric film 10.

Similarly to the third embodiment, the side wall 6', for example, a nitride film, is deposited on the overall surface. Then, an anisotropic etching technique, such as the RIE method, is employed to etch the insulating film 6' so as to expose the gate insulating film 1 in the region of the contact hole 12, and the side wall 6' is left on the side wall of the gate electrode 2, that of the insulating film 4 and that of the interlayer dielectric film 10. FIG. 7D shows the cross section of the semiconductor apparatus in the foregoing state.

The gate insulating film 1 in the region of the contact hole 12 is removed, and then the wiring layer 13 is formed by using, for example, tungsten. As a result, a semiconductor apparatus formed as shown in FIG. 7E is manufactured.

As described above, the fourth embodiment is characterized in that the side wall is not formed on the side wall of the gate electrode 2, the contact hole 12 is formed, and the side wall 6' is formed after the contact hole 12 has been formed.

In addition to the effect obtainable from the third embodiment, the fourth embodiment having the structure such that only the side wall 6' prevents short circuit between the gate electrode 2 and the wiring layer 13 enables the area for the contact hole 12 to easily be maintained as compared with the third embodiment in which the side wall 6 and the side wall 6' are formed on the side wall of the gate electrode 2.

A fifth embodiment of the present invention will now be described with reference to FIGS. 8A to 8G. The fifth embodiment is structured to reliably prevent short circuit between the gate electrode 2 and the wiring layer 13.

Figure 8A:
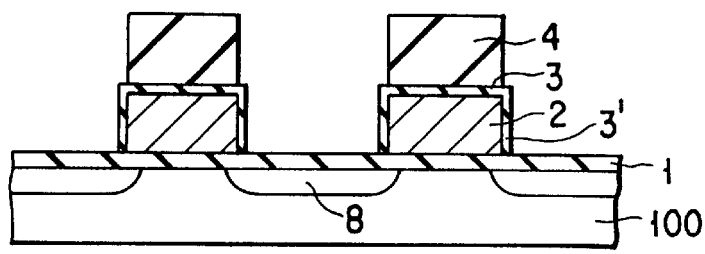
FIGS. 8A to 8G are cross sectional views showing the structure of a semiconductor apparatus in each step of a method of manufacturing a semiconductor apparatus according to a fifth embodiment of the present invention.
Figure 8B:
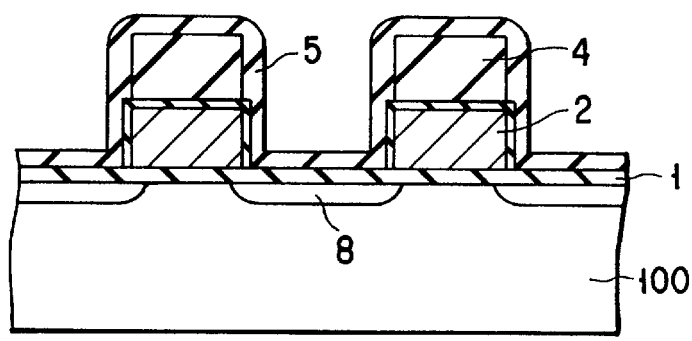

Similarly to the fourth embodiment, the gate electrode 2 is processed so that the diffusion layer 8 is formed. FIG. 8A shows a state similar to that shown in FIG. 7A. Note that the side wall 6 may be provided for the gate electrode 2 similarly to the third embodiment.

Then, a process different from that according to the fourth embodiment is performed such that a gate protective insulating film 5, for example, a nitride film, is deposited to cover the gate electrode 2 prior to forming the insulating layer 7. FIG. 6B shows the cross section of the semiconductor apparatus in the foregoing state.

Figure 8C:
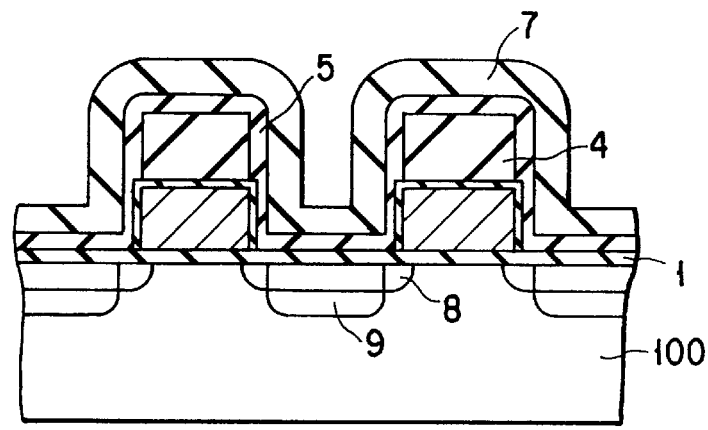

Then, similarly to the fourth embodiment, the insulating layer 7 is formed on the overall surface, and then ions are implanted through the insulating layer 7 and the gate protective insulating film 5 so that the diffusion layer 9 is formed. FIG. 8C shows the cross section of the semiconductor apparatus in the foregoing state.

Figure 8D:
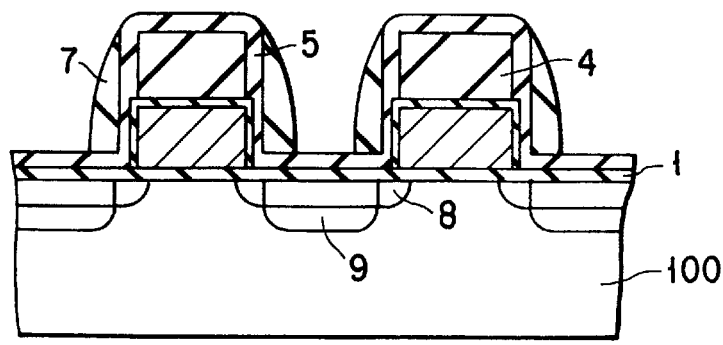

Similarly to the second embodiment, the insulating layer 7 may be etched anisotropically to leave the insulating layer 7 in the side portion of the gate electrode 2. FIG. 8D shows the cross section of the semiconductor apparatus when the insulating layer 7 has been etched anisotropically.

Figure 8E:
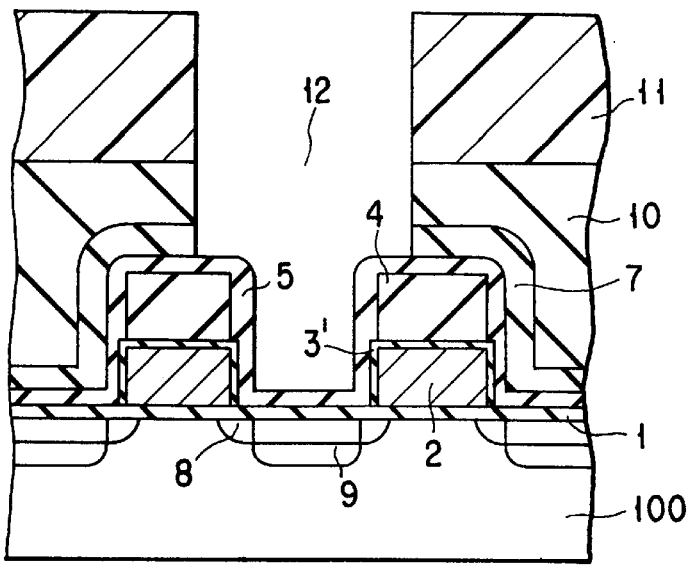

Similarly to the fourth embodiment, the interlayer dielectric film 10, made of, for example BPSG, is deposited, and then a flattening process is performed if necessary. Then, the resist film 11 having a contact hole region formed therein is formed on the interlayer dielectric film 10. Then, an anisotropic etching technique, such as the RIE method, is employed to etch the interlayer dielectric film 10 and the insulating layer 7 by using the resist film 11 as a mask so that an opening portion 12 is formed. FIG. 8E shows the cross section of the semiconductor apparatus in the above-mentioned state. At this time, the etching conditions are determined such that the etching speed of the interlayer dielectric film 10 and the insulating layer 7 is higher than the etching speed of the gate protective insulating film 5.

Then, the gate protective insulating film 5 is etched by an anisotropic etching technique, for example, the RIE method, so as to expose the gate insulating film 1 in the region of the contact hole 12. At this time, it is preferable that the etching conditions be determined such that the etching speed of the gate protective insulating film 5 is higher than the etching speed of the gate insulating film 1. As a result, the gate insulating film 1 serves as the protective film so that etching of the substrate 100 and damage of the same are prevented.

Figure 8F:
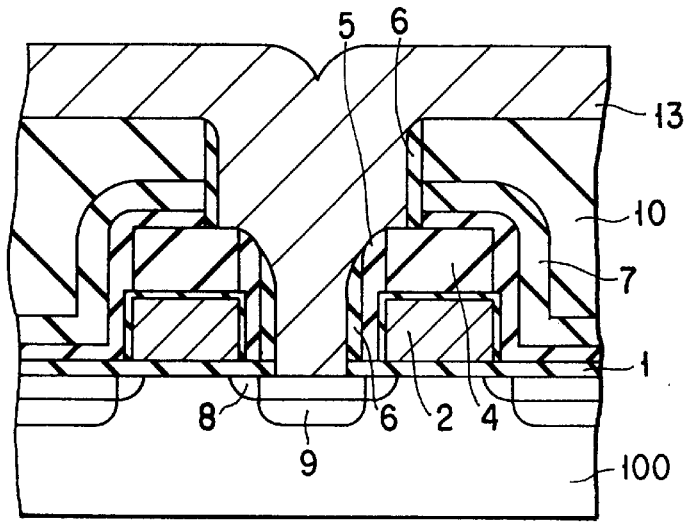

Then, the resist film 11 is removed similarly to the fourth embodiment, and then the side wall 6, which is, for example, a nitride film, is formed on the side wall of the contact hole 12. Then, the gate insulating film 1 in the contact hole region is removed to expose the substrate 100 so that the wiring layer 13 is formed. FIG. 8F shows the cross section of the semiconductor apparatus in the foregoing state.

Figure 8G:
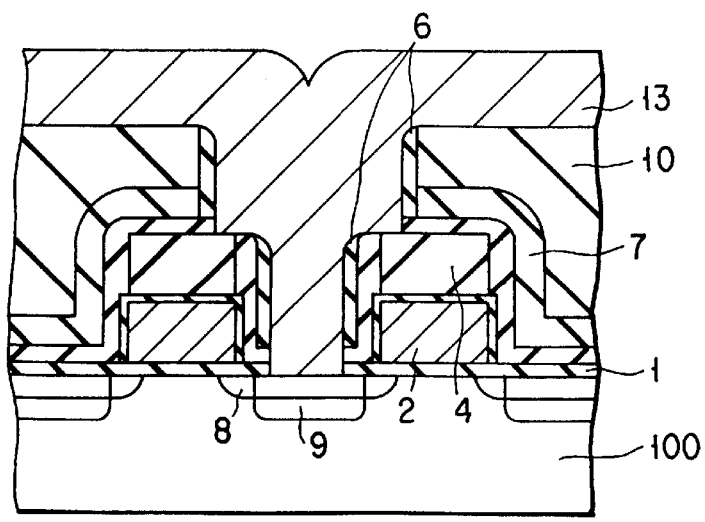

Although this embodiment is structured such that the an opening is formed in the interlayer dielectric film 10 and then the gate protective insulating film 5 is etched, another method may be employed in which the resist film 11 is removed, the side wall 6 is deposited on the overall surface, and then an anisotropic etching technique, such as the RIE method, is employed to simultaneously etch the side wall 6 and the gate protective insulating film 5 so as to expose the gate insulating film 1 in the contact hole region. Then, similarly to the foregoing method, the gate insulating film 1 is removed, and then the wiring layer 13 is formed. FIG. 8G shows the cross section of the thusformed semiconductor apparatus.

If necessary, an ion implantation method may be employed to add impurities to the substrate 100 after the gate insulating film 1 in the contact hole region has been exposed so as to reduce the contact resistance.

As described above, the fifth embodiment is characterized in that the gate protective insulating film 5 is previously formed to cover the gate electrode 2 prior to depositing the insulating layer 7.

In general, etching is sometimes slightly performed in the lateral direction attributable to dispersion in the etching conditions or the like even if the anisotropic etching technique, such as the RIE method, is employed. Therefore, the fourth embodiment in which the contact hole 12 is formed without forming the side wall 6 has a possibility that the sidewall oxide 3' on the side surface of the gate electrode 2 and the side surface of the gate electrode 2 are etched when the interlayer dielectric film 10 and the insulating layer 7 are etched to form the contact hole 12.

On the other hand, this embodiment has the structure such that the gate electrode 2 is covered with the gate protective insulating film 5 when the interlayer dielectric film 10 and the insulating layer 7 are etched. Therefore, the gate electrode 2 is not etched and thus the gate electrode 2 can reliably be protected. By making the etching speed of the interlayer dielectric film 10 and the insulating layer 7 to be higher than the etching speed of the gate protective insulating film 5, the gate electrode 2 can reliably be protected.

Note that the gate protective insulating film 5 according to this embodiment may be applied to the first embodiment.

A sixth embodiment of the present invention will now be described with reference to FIGS. 9A to 9E.

Initially, the gate insulating film 1 is formed on the substrate 100 which is a silicon substrate. Then, a material for forming the gate electrode is deposited on the gate insulating film 1, and then the insulating film 4, such as a nitride film, is deposited on the material for forming the gate electrode.

Then, patterning of the gate is performed, and then the anisotropic etching technology is employed to etch the insulating film 4 and the material for forming the gate electrode so that the gate electrode 2 is formed. Then, the oxide film 3 is formed on the side surface of the gate electrode 2.

Figure 9A:
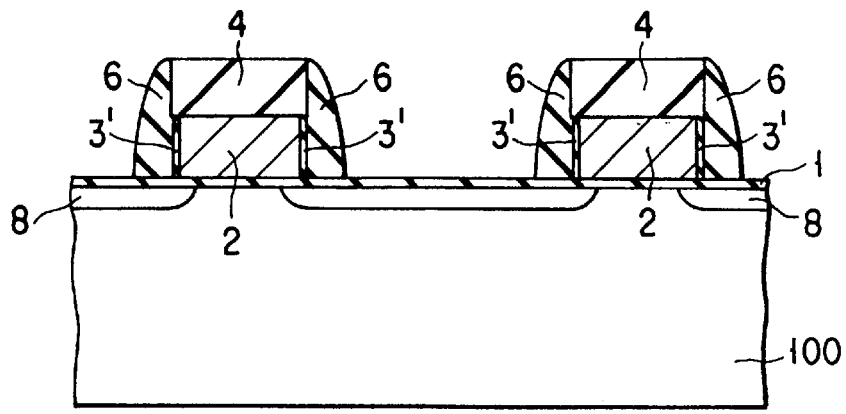
FIGS. 9A to 9E are cross sectional views showing the structure of a semiconductor apparatus in each step of a method of manufacturing a semiconductor apparatus according to a sixth embodiment of the present invention.

Then, an insulating film is used to form a first side wall 6, and then impurities, such as arsenic, are added to the interlayer dielectric film 10 by the ion implantation method or the like so that the source/drain diffusion layer (a first source/drain diffusion layer) 8 is formed. The cross section of the semiconductor apparatus in the foregoing state is shown in FIG. 9A. The source/drain diffusion layer 8 may be formed before the side wall 6 is formed.

Figure 9B:
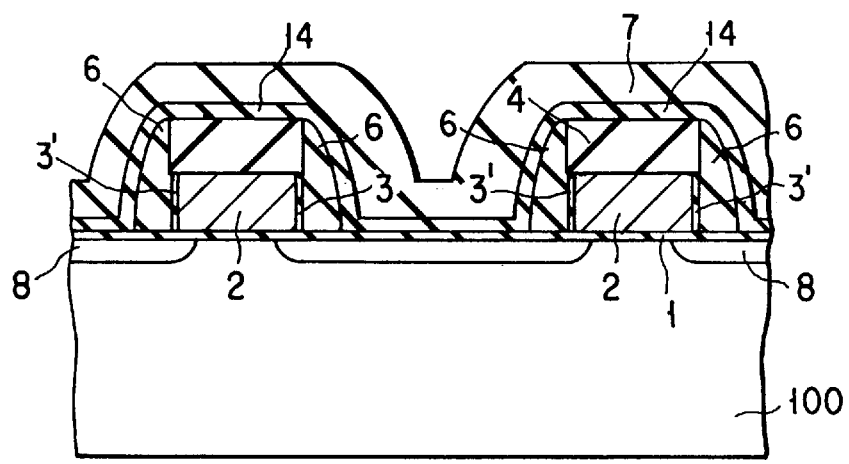

Then, a insulating film 14 is formed on the elements shown in FIG. 9A. A SiN film or the like is employed to form the insulating film 14. Further on the insulating film 14, the insulating layer 7 is used as the protective film so as to be deposited to have a thickness with which the area between the gates is not plugged. BPSG or the like is employed to form the insulating layer 7. The cross section of the semiconductor apparatus in the foregoing state is shown in FIG. 9B. The foregoing process is the same as that according to the first embodiment except for the structure in which the oxide film 3 is not formed on the material for forming the gate electrode and the insulating film 14 is formed below the insulating layer 7.

Figure 9C:
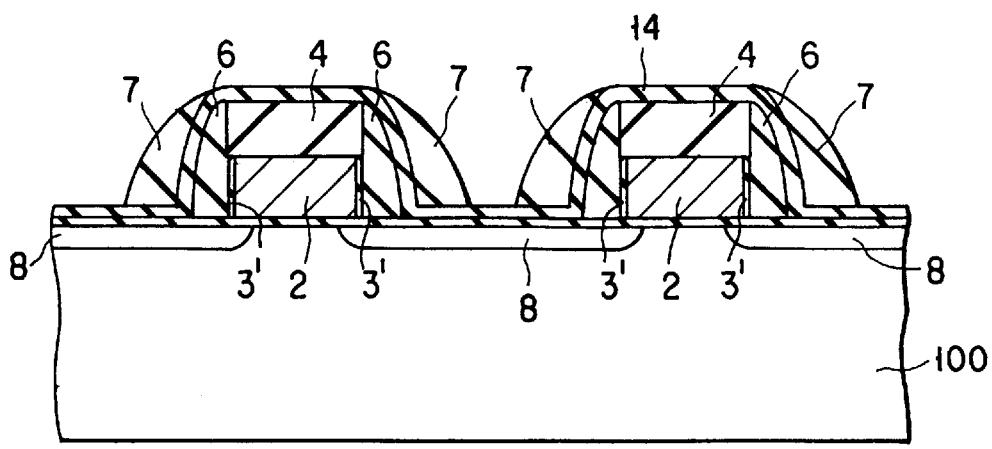

The insulating film of a type different from the insulating layer 7 is used to form the insulating film 14. The insulating layer 7 is etched so that the side wall 7 made of the insulating layer 7 is formed, as shown in FIG. 9C.

When the side wall 7 is formed, RIE conditions are employed under which the insulating film for forming the insulating layer 7 can selectively be etched with respect to the insulating film 14 for forming the substrate 100. By selectively performing etching to leave the insulating film 14, the substrate is protected from damage in the following etching process and diffusion of impurities from the interlayer dielectric film to the substrate can be prevented. To achieve the foregoing effect, SiN may be employed to form the protective film (the insulating film 14) for the substrate 100 and BPSG or the like may be employed to form the side wall 7 on the protective film.

Figure 9D:
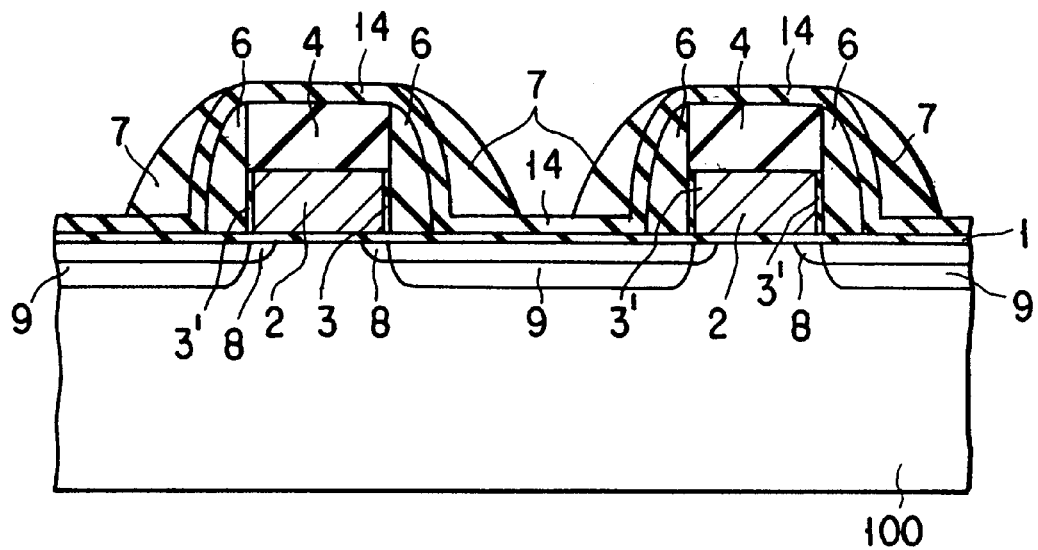

After the side wall 7 has been formed, the second source/drain diffusion layer 9 is formed. The cross section of the semiconductor apparatus in the foregoing state is shown in FIG. 9D.

Figure 9E:
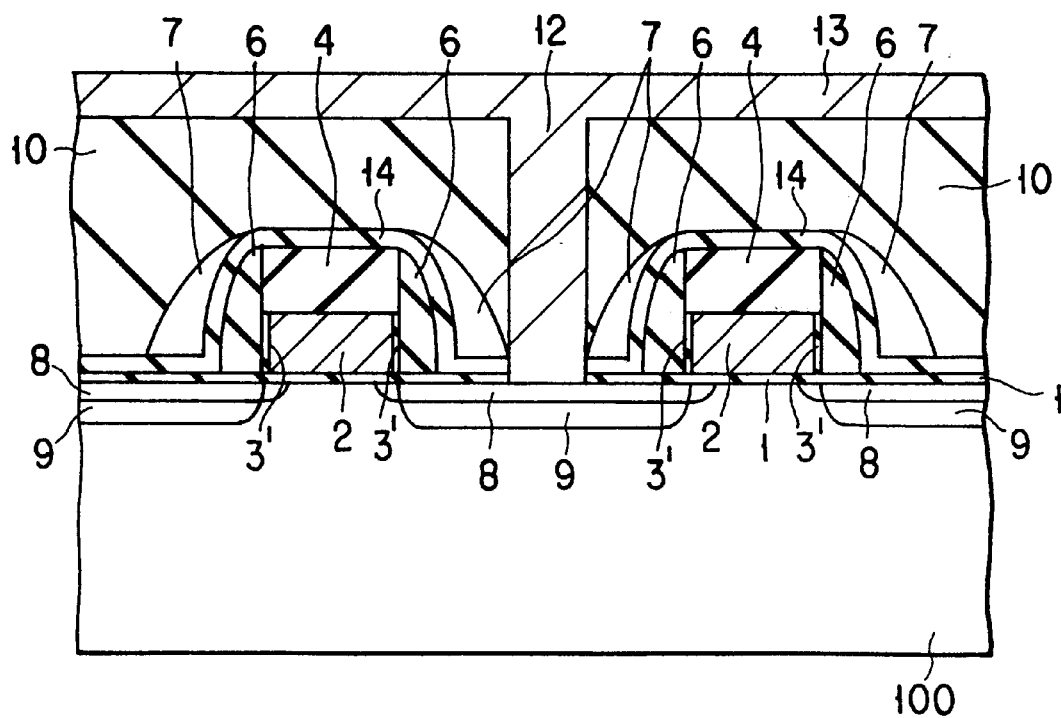

In the above-mentioned state, the interlayer dielectric film 10 is deposited, and then RIE is performed to form the contact hole 12. A cross section of the semiconductor apparatus in the foregoing state where the wiring layer 13 has been formed after the RIE is shown in FIG. 9E. To form the contact hole 12 in the self-align manner, RIE conditions are employed under which the interlayer dielectric film 10 can selectively be etched with respect to the insulating film 4. To achieve this, SiN is employed to form the insulating film 4 on the gate and BPSG or the like may be employed to form the interlayer dielectric film 10.

The sixth embodiment is characterized in that the insulating film 14 serving as the protective film for the substrate 100 is deposited; and then the side wall made of a material different from that for forming the insulating film 14 is formed.

Moreover, the sixth embodiment has the structure such that the insulating film 14 is employed as the gate oxidation protective film and the insulating film (the side wall) 7, which is a film of the same type as the interlayer dielectric film, is used as the mask for implanting ions. As a result, even if a resist for forming the contact hole is applied, diffusion of impurities occurring due to the applied resist can be prevented.

In addition, the source/drain diffusion layer may be provided regardless of the thickness of the side wall film 7.

Furthermore, since the side wall 7 and the insulating film 14 are partially removed when the contact hole 12 is formed, a sufficiently large area can be provided for forming the contact hole.

A seventh embodiment of the present invention will now be described with reference to FIGS. 10A and 10C.

The seventh embodiment has steps similarly to those according to the first embodiment except for the amount of deposition of the insulating layer 7, that is, the thickness.

Figure 10A:
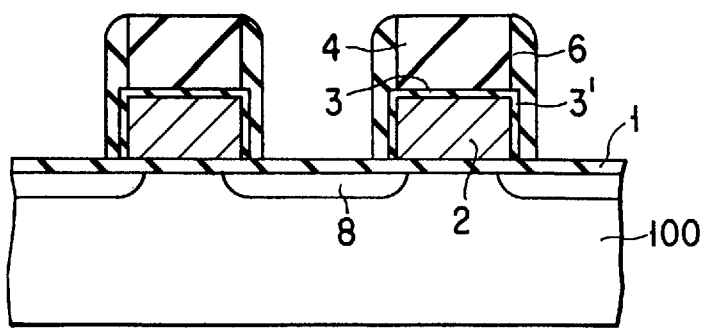
FIGS. 10A to 10C are cross sectional views showing the structure of a semiconductor apparatus in each step of a method of manufacturing a semiconductor apparatus according to a seventh embodiment of the present invention.
Figure 10B:
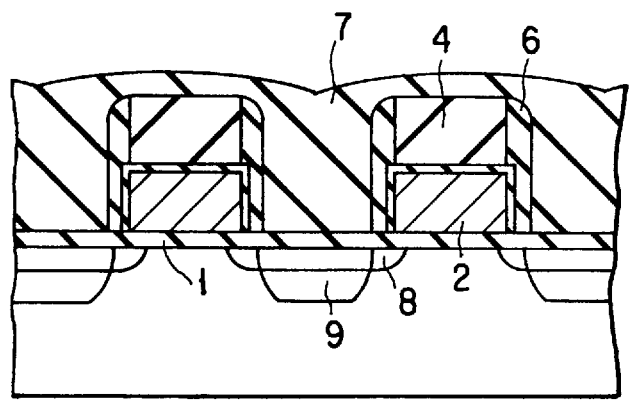
Figure 10C:
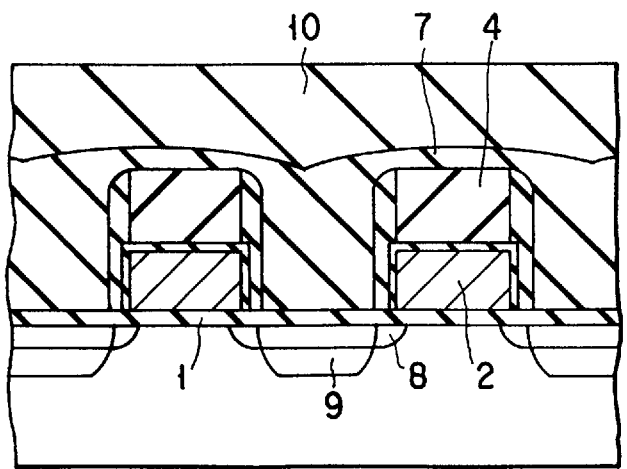

As shown in FIG. 10A, the side wall 6 is formed on the side walls of the gate electrode 2 and the insulating film 4 (similarly to the first embodiment shown in FIG. 3A). Then, the insulating layer 7 made of a BPSG film or the like is deposited. In the first embodiment, the insulating layer 7 is deposited to an extent with which the area between the gates is not plugged, as shown in FIG. 3B. In the seventh embodiment, the insulating layer 7 is deposited to plug the area between gates, as shown in FIG. 10B.

A process similar to that according to the first embodiment is performed after the insulating layer 7 has been deposited. Thus, the interlayer dielectric film 10 is deposited, as shown in FIG. 10C.

In the seventh embodiment, a large thickness is realized as compared with the first embodiment. Therefore, even if the resist film 11 or the like is applied afterwards, an influence of the impurities on the substrate 100 can be eliminated as compared with the first embodiment.

An eighth embodiment of the present invention will now be described with reference to FIGS. 11A to 11C.

The eighth embodiment, having a process similar to that according to the seventh embodiment, is characterized in that the insulating film 14 is formed below the insulating layer 7.

Figure 11A:
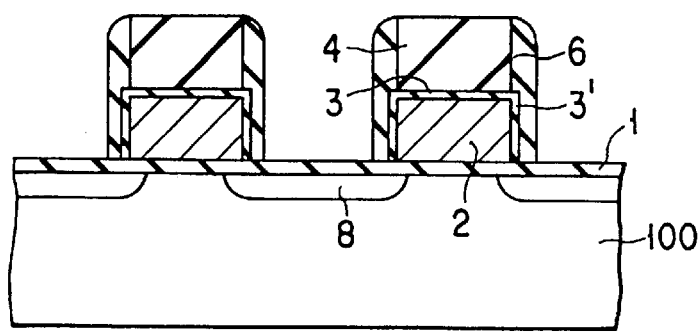
FIGS. 11A to 11C are cross sectional views showing the structure of a semiconductor apparatus in each step of a method of manufacturing a semiconductor apparatus according to an eight embodiment of the present invention.
Figure 11B:
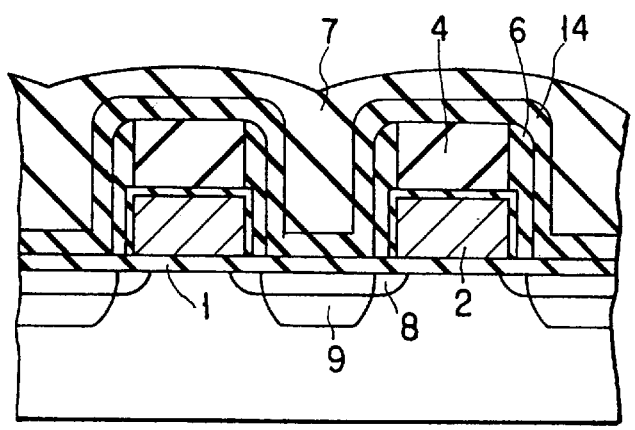

As shown in FIG. 11A, a side wall 6 is formed on the side walls of the gate electrode 2 and the insulating film 4 (see FIG. 3A showing the first embodiment). Then, a SiN film or the like is employed to form the insulating film 14. Then, BPSG or the like is employed so that the insulating layer 7 is deposited on the insulating film 14. Note that the insulating layer 7 is, as shown in FIG. 11B, deposited to plug the space between the gates.

Figure 11C:
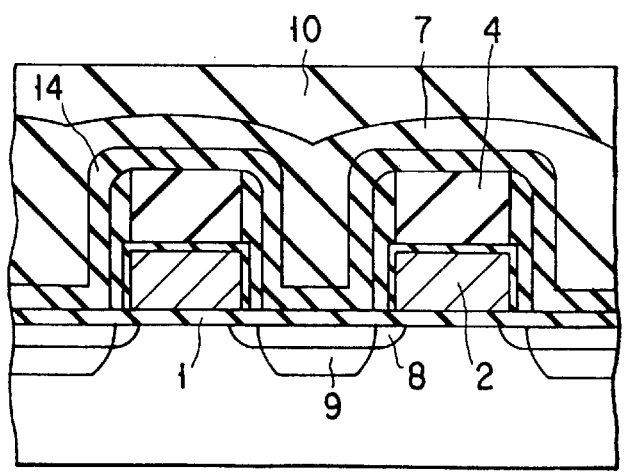

A process similar to that according to the first embodiment is performed after the insulating layer 7 has been deposited so that an interlayer dielectric film 10 is deposited, as shown in FIG. 11C.

Similarly to the seventh embodiment, the eighth embodiment has the structure such that the insulating layer 7 has larger thickness as compared with that according to the first embodiment and the insulating film 14 made of the material different from that of the insulating layer 7 is formed below the insulating layer 7.

Therefore, even if the resist film 11 or the like is applied in order to form the contact hole, the influence of impurities on the semiconductor substrate 100 can satisfactorily be eliminated.

Embodiments of the method of manufacturing the semiconductor apparatus represented by a DRAM including the peripheral circuit portions and cell portions and according to the respective embodiments will now be described. The description will be performed such that the peripheral circuit portions and the cell portions are contrasted.

In general, a semiconductor storage device, such as a DRAM, has a structure such that the core region (the cell portion) in which memory cells are integrated has a very high pattern density and a peripheral circuit region (the peripheral circuit portion) for driving the memory cells has a low pattern density. The transistor arranged to be formed in the region in which the pattern density is low generally has a long distance from the channel portion to the contact hole. Therefore, it is preferable that a deep source/drain diffusion layer be formed in order to weaken the parasitic resistance in the foregoing portion. On the other hand, it is preferable that the transistor arranged to be formed in the region in which the pattern density is high be formed such that a shallow source/drain diffusion layer is formed in order to restrict the short channel effect and improve the resistance against pressure for separating the devices.

A ninth embodiment will now be described with reference to FIGS. 12A to 12E. Each of FIGS. 12A to 12D shows the cross section of the cell portion in the left-hand portion thereof and the peripheral circuit portion in the right-hand portion thereof.

In the ninth embodiment, transistors having the different structures are simply formed by the method according to the fourth embodiment.

Similarly to the fourth embodiment, the gate electrode 2 is processed so that the source/drain diffusion layer 8 is formed. FIG. 12A shows the cross section of the semiconductor apparatus in the foregoing state.

Similarly to the fourth embodiment, the insulating layer 7, made of, for example, BPSG, is deposited on the overall surface. Then, a process different from that according to the fourth embodiment is performed such that the resist film 11 is applied to the overall surface. Then, the photolithographic technology is used to remove the resist film 11 in the peripheral circuit portion for forming the deep source/drain diffusion layer 9 as shown in FIG. 12B which is a cross sectional view showing the peripheral circuit portion. Then, the ion implantation method or the like is employed to add impurities, for example, arsenic, to the region of the substrate 100, in which the deep source/drain diffusion layer will be formed, through the insulating layer 7. FIG. 12B shows the cross section of the semiconductor apparatus in the foregoing state in the cell portion and the peripheral circuit portion. Then, the resist film 11 is removed, and a proper heat treatment is performed so that the diffusion layer 9 is formed.

If the diffusion layer 9 is, at this time, formed in order to reduce the parasitic resistance as described above, it is preferable that the diffusion layer 9 be formed deeper than, for example, the source/drain diffusion layer B. In the foregoing case, the insulating layer 7 formed on the side wall of the gate electrode 2 is used as the mask to implant ions to form the deep source/drain diffusion layer 9. Therefore, the diffusion layer 9 is not diffused deeply into the position below the gate electrode 2. Thus, the effective channel length is not shortened.

Then, the interlayer dielectric film 10 is deposited on the overall surface, and a flattening process is performed, if necessary. Then, a resist film 11' is applied to the overall surface, and then the photolithographic technology is employed to form an opening portion in the resist film 11', the opening portion corresponding to the contact hole portion which is formed in the self-align manner with the gate electrode 2 in the cell portion. For example, an anisotropic etching technique, such as the RIE method, is employed to etch the interlayer dielectric film 10 and the insulating layer 7 to expose the gate insulating film 1 so that the opening portion 12 is formed. FIG. 12C shows the cross section of the semiconductor apparatus in the foregoing state in the cell portion and the peripheral circuit portion. At this time, it is preferable that the etching conditions be determined such that the etching speed of the interlayer dielectric film 10 and the insulating layer 7 is higher than the etching speed of the insulating film 4 and the gate insulating film 1, as described above. Thus, short circuit between the gate electrode 2 and the wiring layer 13 and damage of the substrate 100 during the etching operation can be prevented.

Then, the resist film 11' is removed, and then the resist film 11" is applied to the overall surface. Then, the photolithograph technology is employed to form an opening portion in the resist film 11", the opening portion corresponding to the contact hole portion which is not required to be formed in a selfalign manner with the gate electrode 2. Then, an anisotropic etching technique, for example, the RIE method, is employed to etch the interlayer dielectric film 10 and the insulating film 7 so as to expose the gate insulating film 1 so that the opening portion 12' is formed. FIG. 12D shows the cross section of the semiconductor apparatus in the foregoing state. At this time, it is preferable that the etching conditions be determined such that the etching speed of the interlayer dielectric film 10 and the insulating layer 7 is higher than the etching speed of the gate insulating film 1. Thus, the substrate 100 can be protected from being damaged during the etching operation.

Then, the resist film 11" is removed so that the side wall 6' is formed on the side walls of the opening portion 12 and the opening portion 12", similarly to the fourth embodiment. Then, the gate insulating film 1 is removed, and then the wiring layer 13 is formed. FIG. 12E shows the cross section of the cell portion and the peripheral circuit portion of the semiconductor apparatus in the foregoing state.

As described above, the ninth embodiment is characterized in that the deep source/drain diffusion layer 9 is formed in only the transistor which is formed in the region of, for example, the peripheral circuit portion in which the pattern density is low.

By forming the above-mentioned diffusion layer 9, the parasitic resistance of the transistor in the peripheral circuit portion can be weakened. When the diffusion layer 9 is formed, the insulating layer 7 on the side wall of the gate electrode 2 serves as the mask when ions are implanted, similarly to the fourth embodiment. Therefore, shortening of the effective channel length of the transistor by the diffusion layer 9 can be prevented.

In the ninth embodiment, the insulating layer 7 which has been used as the mask in the ion implanting operation is removed together with the interlayer dielectric film 10 when the contact hole 12 is formed. Therefore, reduction in the region of the contact hole 12 can be prevented. In the case of this embodiment in which the region (the cell portion) having a high pattern density and the region (the peripheral circuit portion) having a low pattern density are mixed, the area of the contact hole of the transistor formed in the region having the high pattern density can be enlarged to weaken the contact resistance. As a result, a semiconductor apparatus having excellent performance can be manufactured.

Moreover, the ninth embodiment has the structure such that the contact hole 12 formed in the self-align manner with the gate electrode 2 and the other contact hole 12' are formed by individual etching processes. Therefore, the etching conditions can individually be determined. Thus, the insulating film 4 on the gate electrode 2 and the substrate 100 are not etched unintentionally. As compared with the method in which the contact holes 12 and 12' are formed simultaneously, the problems of short circuit between the gate electrode 2 and the wiring layer 13 and damage of the substrate 100 can easily be prevented.

If the insulating layer 7 and the interlayer dielectric film 10 are made of the same material, etching can easily be performed in the process for forming the contact hole 12 and the process for forming the contact hole 12'. Therefore, it is preferable that the foregoing films be made of the same material.

Figure 13A:
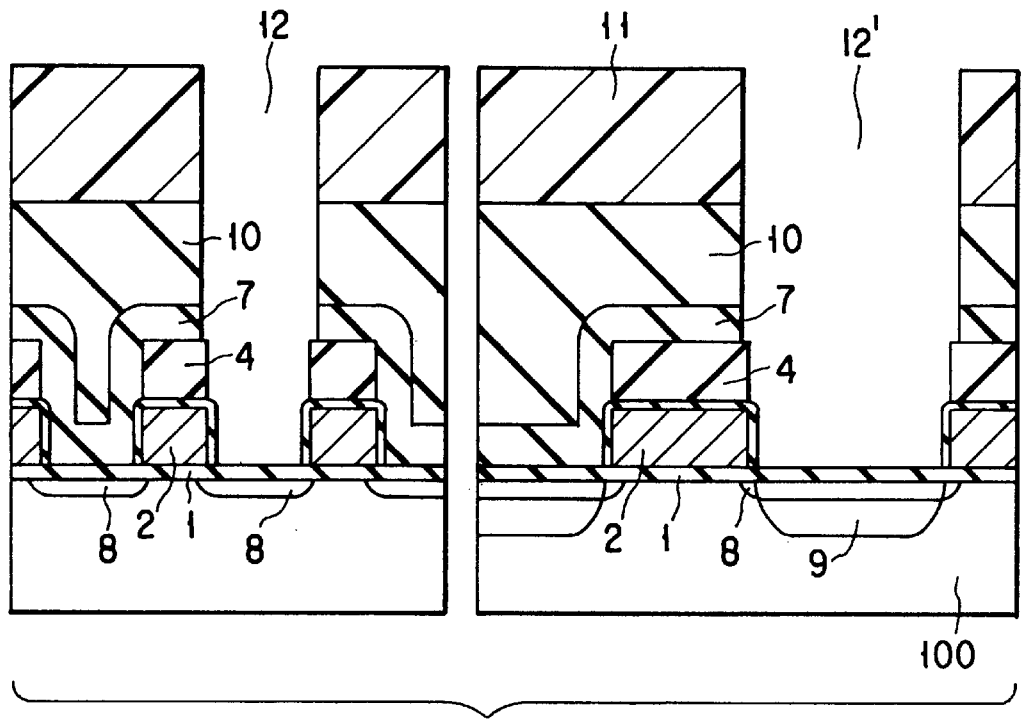
FIGS. 13A and 13B are cross sectional views showing the structure of a semiconductor apparatus in each step of a method of manufacturing a semiconductor apparatus according to a tenth embodiment of the present invention.
Figure 13B:
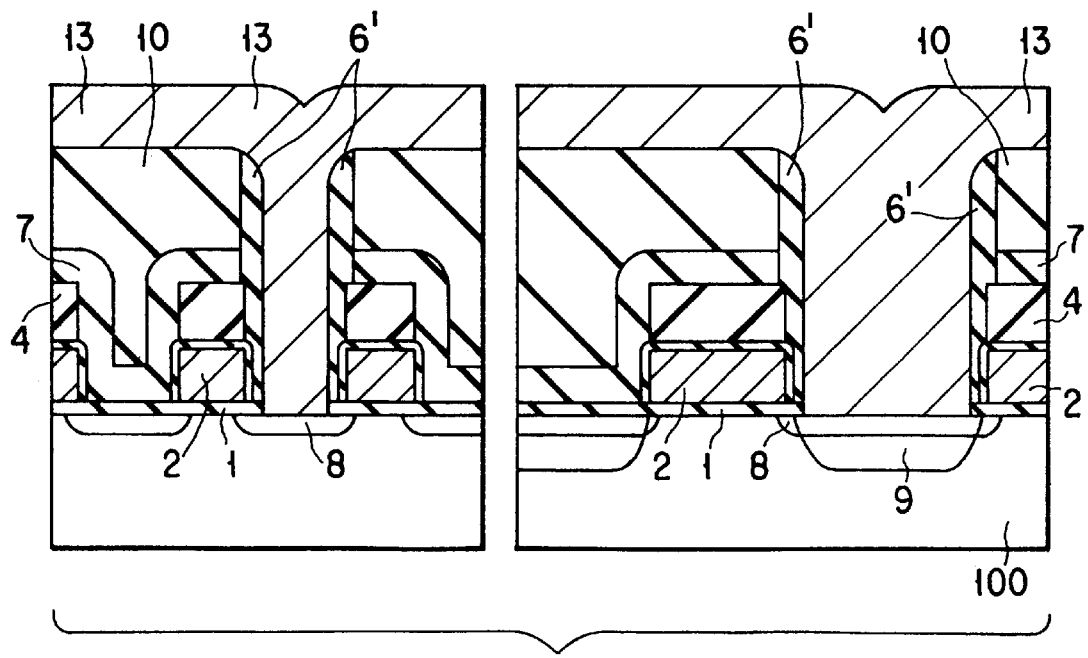

A tenth embodiment of the present invention will now be described with reference to FIGS. 13A and 13B. The ninth embodiment has the structure such that the contact hole on the cell portion and the contact hole in the peripheral circuit portion are formed by individual etching operations. On the other hand, the tenth embodiment has a structure such that the contact hole 12 in the region having a high pattern density (the cell portion) and the contact hole 12' in the region having a low pattern density (the peripheral circuit portion) of the semiconductor apparatus are formed simultaneously. Each of FIGS. 13A and 13B shows the cell portion in the left-hand portion thereof and the peripheral circuit portion in the right-hand portion thereof, similarly to FIGS. 12A to 12E.

In the tenth embodiment, the process until the interlayer dielectric film 10 is formed is similar to that according to the ninth embodiment. Therefore, the similar process is omitted from the detailed description. Then, the resist film 11 is applied to the overall surface of the resist film 11, and then the photolithographic technology is used to form openings corresponding to the contact hole portions in the cell portion and those in the peripheral circuit portion in the resist film 11 such that the interlayer dielectric film 10 and the insulating layer 7 are etched to form opening portions 12 and 12'. FIG. 13A shows the cross section of the cell portion and the peripheral circuit portion of the semiconductor apparatus in the foregoing state. In the ninth embodiment, the contact hole 12' in the peripheral circuit portion is not formed in the self-align manner with the gate electrode 2. In this embodiment, both of the contact holes 12 and 12' are formed in a self-align manner with the gate electrode 2 regardless of the pattern density.

Then, the side wall 6' is formed on the side walls of the opening portions 12 and 12', and then the wiring layer 13 is formed, similarly to the ninth embodiment. FIG. 12B shows the cross section of the cell portion and the peripheral circuit portion of the semiconductor apparatus in the foregoing state.

As described above, the tenth embodiment is characterized in that the contact hole 12' is formed in the self-align manner with the gate electrode 2 also in the peripheral circuit portion, that is, the region having a low pattern density. As a result, the etching conditions for forming the contact hole in the cell portion, that is the region having a high pattern density and those for forming the contact hole in the peripheral circuit portion can be made to be the same. Therefore, the contact holes formed in the two processes in the ninth embodiment can be formed in one process. Thus, the manufacturing process can be simplified.

If the contact hole to be formed in a self-align manner with the gate electrode and the contact hole which is not formed in the self-align manner with the gate electrode can be formed under the same etching conditions, the contact holes may be formed simultaneously in the ninth embodiment.

An eleventh embodiment of the present invention will now be described with reference to FIGS. 14A and 14B.

The eleventh embodiment is structured such that the diffusion layer 9 of the semiconductor apparatus having the cell portion having a high pattern density and the peripheral circuit portion having a low pattern density is formed similarly to the second embodiment but more simply. Each of the cross sectional views of the semiconductor apparatus shown in FIGS. 14A and 14B shows the cell portion in the left-hand portion thereof and the peripheral circuit portion in the right-hand portion thereof, similarly to FIGS. 12A to 13B.

In the eleventh embodiment, the gate electrode 2, the diffusion layer 8 and the insulating layer 7 are formed similarly to the ninth embodiment. Then, the resist film 11 is applied to the overall surface, and the photolithography technology is employed to remove the resist in the region in which the diffusion layer 9 will be formed, that is, from the peripheral circuit portion.

Then, a process different from that according to the ninth embodiment is performed such that an anisotropic etching technique, such as the RIE method, is employed similarly to the second embodiment to etch the insulating layer 7. FIG. 14A shows the cross section of the semiconductor apparatus in the foregoing state. As a result of the etching operation above, the gate insulating film 1 in the region in which the diffusion layer 9 will be formed may be exposed. As an alternative to this, the insulating layer 7 may be left as shown in FIG. 14A. Then, the ion implantation method or the like is employed to add impurities, such as arsenic, to the region of the substrate 100 in which the diffusion layer 9 will be formed. Then, a proper heat treatment is performed so that the diffusion layer 9 is formed.

Then, the interlayer dielectric film 10, the contact holes 12 and 12', the side wall 6' and the wiring layer 13 are formed similarly to the ninth embodiment. FIG. 14B shows the cross section of the cell portion and the peripheral circuit portion of the semiconductor apparatus in the foregoing state.

In the ninth embodiment, impurities must be ion-implanted into the substrate 100 through the insulating layer 7 in order to form the diffusion layer 9. If the insulating layer 7 has a large thickness, the accelerated voltage for implanting ions must be raised considerably. Therefore, impurities cannot sometimes reach the substrate 100 or the deep diffusion layer 9 cannot sometimes easily be formed. However, the eleventh embodiment employing the anisotropic etching technology is able to leave the insulating layer 7 on the side wall of the insulating layer 7 and etch the insulating layer 7 in the region in which the diffusion layer 9 will be formed. Therefore, the deep diffusion layer 9 can easily be formed as compared with the ninth embodiment.

Although the eleventh embodiment has the structure such that the insulating layer 7 is etched after the resist film 11 has been applied and the same has been patterned, the sequential order may be inverted such that the insulating layer 7 is etched before the resist film 11 is formed.

A twelfth embodiment of the present invention will now be described with reference to FIGS. 15A to 15G. Each of FIGS. 15A to 15G shows the cell portion in the left-hand portion thereof and the peripheral circuit portion in the right-hand portion thereof.

In the twelfth embodiment, the structure according to the seventh embodiment is applied to the cell portion of the semiconductor apparatus and that according to the sixth embodiment is applied to the peripheral circuit portion.

Initially, the gate insulating film 1 is formed on the substrate 100 which is a silicon substrate. Then, a material for forming the gate electrode is deposited on the gate insulating film 1, and then the oxide film 3 is formed on the material for forming the gate electrode. Then, the insulating film 4, for example, the nitride film, is deposited on the oxide film 3.

Then, patterning of the gate is performed, and then the anisotropic etching technology is employed to etch the insulating film 4 and the material for forming the gate electrode so that the gate electrode 2 is formed. Then, the sidewall oxide 3' is formed on the side surface of the gate electrode 2.

Figure 15A:
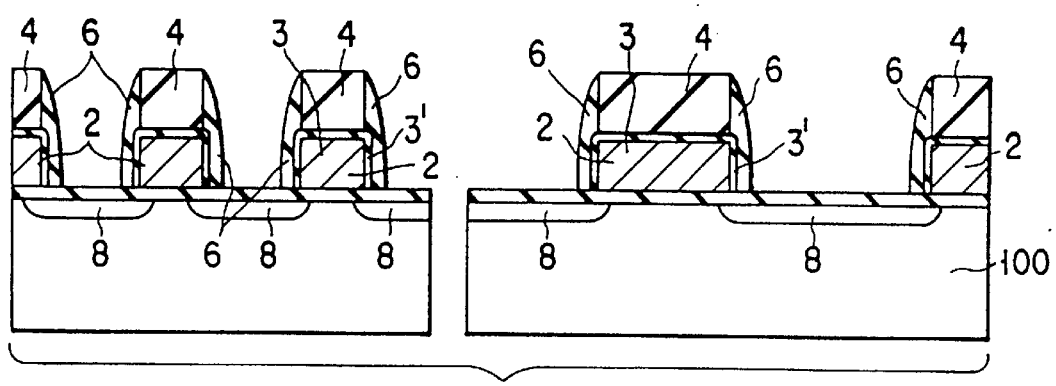
FIGS. 15A to 15G are cross sectional views showing the structure of a semiconductor apparatus in each step of a method of manufacturing a semiconductor apparatus according to a twelfth embodiment of the present invention.

Then, an insulating film is used to form the first side wall 6, and then the ion implantation method or the like is employed to add impurities, such as arsenic, to the substrate 100 so that the source/drain diffusion layer (the first source/drain diffusion layer) 8 is formed. The cross section of the cell portion and the peripheral circuit portion of the semiconductor apparatus in the foregoing state is shown in FIG. 15A. Note that the source/drain diffusion layer 8 may be formed before the side wall 6 is formed.

Figure 15B:
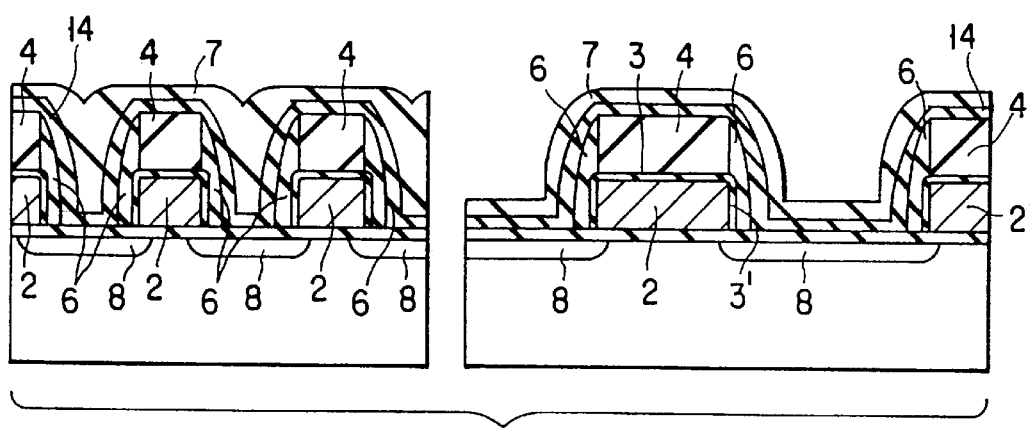

Then, a insulating film 14, such as a SiN film, is deposited on the overall surface. On the insulating film 14, a insulating layer 7 is deposited, similarly to the first embodiment. The insulating layer 7 is deposited to have a thickness with which the area between the gates in the cell portion is plugged and the area between the gates in the peripheral circuit portion is not plugged. The cell portion and the peripheral circuit portion of the semiconductor apparatus in the foregoing state are shown in FIG. 15B.

Figure 15C:
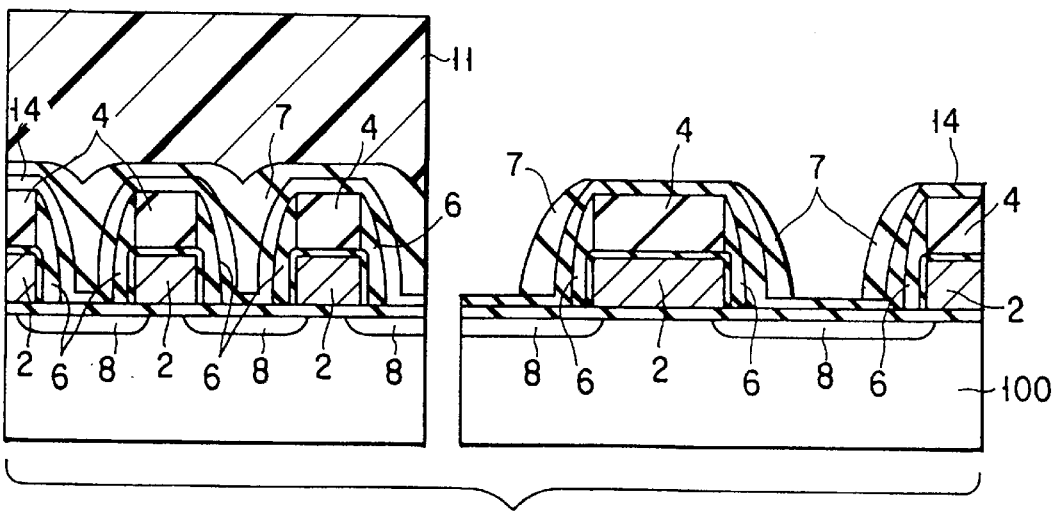

The insulating film 14 is made of a material different from that forming the insulating layer 7. The resist film 11 is applied to the overall surface, and then the photolithography technology is employed to remove the resist film 11 from only the peripheral circuit portion. The insulating layer 7 in the peripheral circuit portion is etched so that the side wall 7 made of the insulating layer 7 is formed, as shown in FIG. 15C.

Figure 15D:
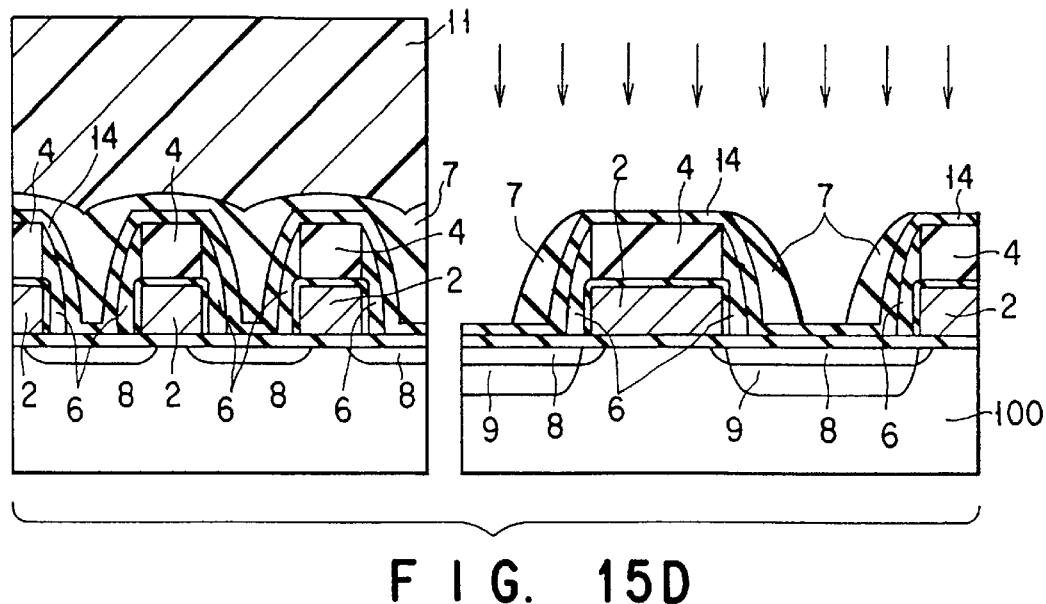

Then, the ion implantation method or the like is employed to add impurities, such as arsenic, to the peripheral circuit portion of the substrate 100 through the insulating film 14. Then, the resist film 11 is removed, and then a proper heat treatment is performed so that the diffusion layer 9 is formed. FIG. 15D shows the cross section of the cell portion and the peripheral circuit portion of the semiconductor in the foregoing state.

Figure 15E:
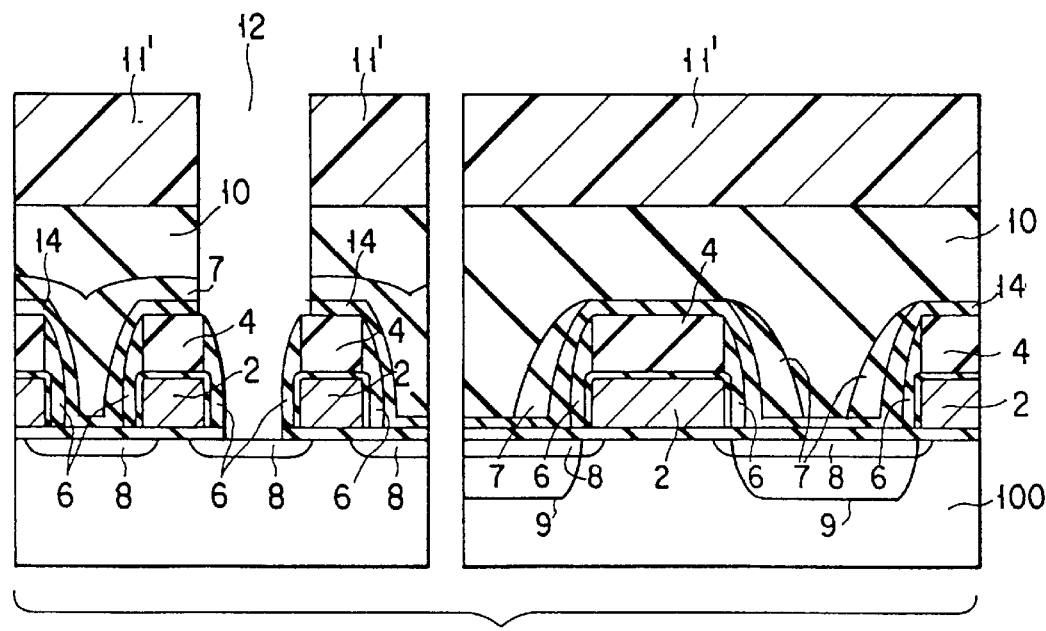

Then, the interlayer dielectric film 10 is deposited on the overall surface, and then a flattening process is performed, if necessary. Then, the resist film 11' is applied to the overall surface, and then the photolithography technology is employed to form an opening portion in the resist film 11', the opening portion corresponding to the contact hole portion which is formed in the self-align manner with the gate electrode 2 in the cell portion. For example, an anisotropic etching technique, for example, the RIE method, is employed to etch the interlayer dielectric film 10 and the insulating film 14 so as to expose the gate insulating film 1 so that the opening portion 12 is formed. A portion of the gate oxide film 1 in a region of the opening portion 12 is removed. FIG. 15E shows the cross section of the semiconductor apparatus in the foregoing state. At this time, it is preferable that the etching conditions be determined such that the etching speed of the interlayer dielectric film 10 and the insulating film 14 is higher than the etching speed of the insulating film 4 and the gate insulating film 1. Thus, short circuit between the gate electrode 2 and the wiring layer 13 and damage of the substrate 100 during the etching operation can be prevented.

Figure 15F:
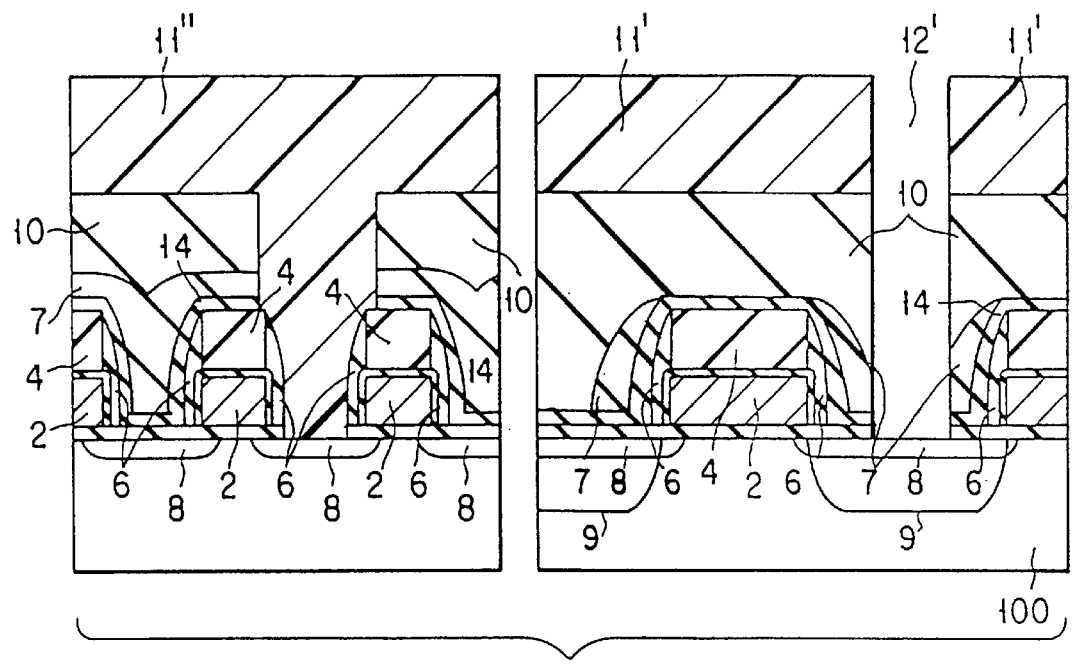

Then, the resist film 11' is removed, and then the resist film 11" is again applied to the overall surface. Then, the photolithography technology is employed to form an opening portion in the resist film 11", the opening portion corresponding to the contact hole portion which is not required to be formed in the self-align manner with the gate electrode 2. Then, an anisotropic etching technique, such as the RIE method, is employed to etch the interlayer dielectric film 10 and the insulating film 14 so as to expose the gate insulating film 1 and the opening portion 12' is formed. A portion of the gate insulating film 1 in a region of the opening portion 12' is removed. FIG. 15F shows the cross section of the semiconductor apparatus in the foregoing state. It is preferable that the etching conditions be determined such that the etching speed of the interlayer dielectric film 10 and the insulating film 14 is higher than the etching speed of the gate insulating film 1. Thus, damage of the substrate 100 during the etching operation can be prevented.

Figure 15G:
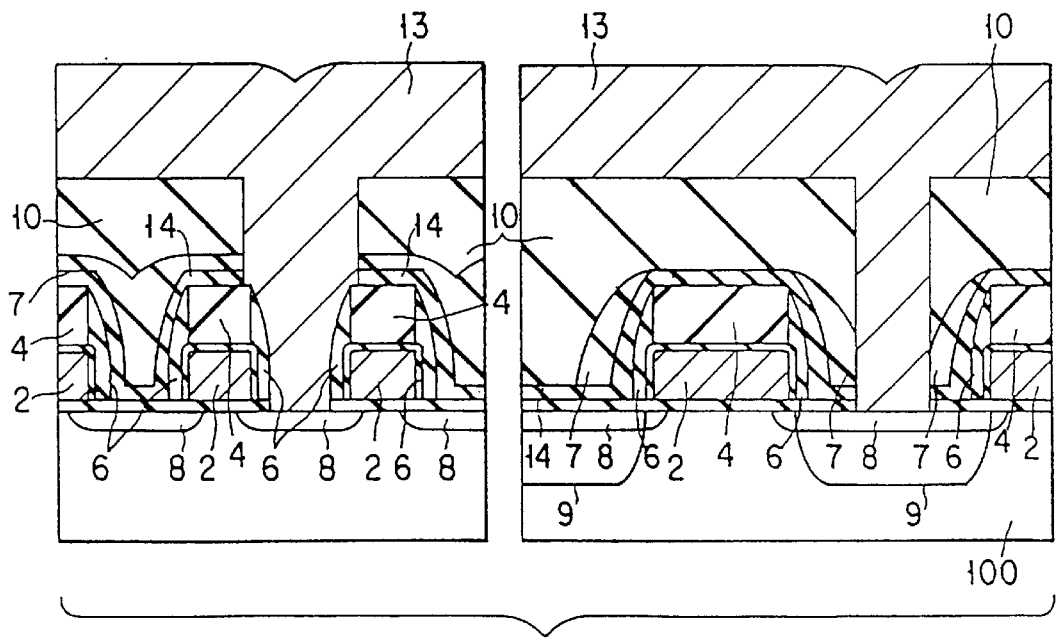

Then, the resist film 11" is removed, and then the side wall 6' is formed on the side walls of the opening portion 12 and the opening portion 12". Then, the wiring layer 13 is formed. FIG. 15G shows the cross section of the cell portion and the peripheral circuit portion of the semiconductor apparatus in the foregoing state.

According to the above-mentioned twelfth embodiment, the cell portion of the semiconductor apparatus is formed to have the characteristic obtainable from the seventh embodiment and the peripheral circuit portion is formed to have the characteristic obtainable from the sixth embodiment.

Therefore, even if the resist film is applied to the cell portion in order to form the contact hole, the influence of impurities on the semiconductor substrate 100 can satisfactorily be eliminated. Even if the resist is applied to the peripheral circuit portion in order to form the contact hole, diffusion of the impurities occurring due to the applied resist can be prevented. Moreover, the source/drain diffusion layer can be provided regardless of the thickness of the side wall 7. In addition, since the side wall is removed when the contact hole is formed, a sufficiently large area can be provided for forming the contact hole.

Figure 16A:
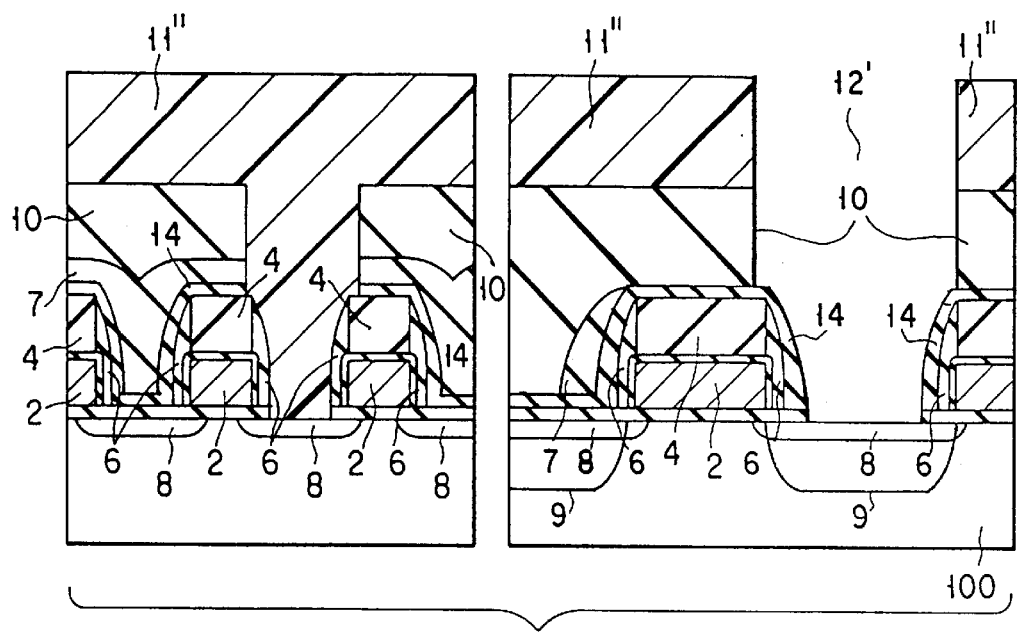
FIGS. 16A and 16B are cross sectional views showing the structure of a semiconductor apparatus in each step of a method of manufacturing a semiconductor apparatus according to a thirtieth embodiment of the present invention.

A thirteenth embodiment of the present invention will now be described with reference to FIGS. 16A and 16B.

The thirteenth embodiment is featured in that the contact hole in the peripheral circuit portion is formed in the self-align manner. In the thirteenth embodiment, the process until the contact hole is formed in the cell portion is similar to that (see FIG. 15E) according to the twelfth embodiment. Therefore, the similar process is omitted from the detailed description.

After the contact hole is formed in the cell portion, a resist film 11" is applied to the overall surface and a contact hole 12' is formed in the peripheral circuit portion in the self-align manner. A portion of the gate insulator film 1 in a region of the contact hole 12' is removed. FIG. 16A shows the cross section of the cell portion and the peripheral circuit portion of the semiconductor apparatus in the foregoing state.

Figure 16B:
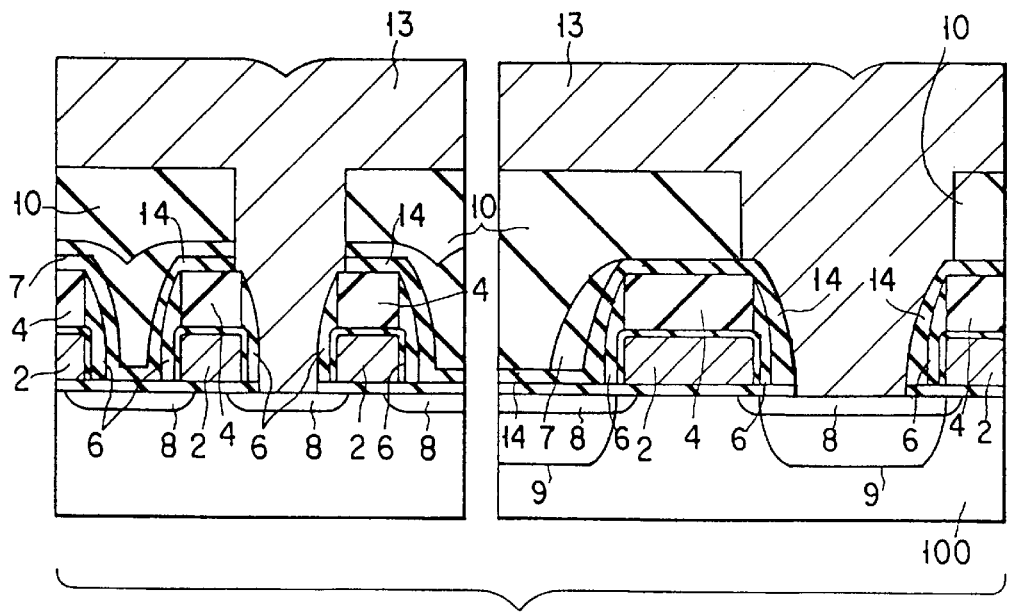

Next, the wiring layer 13 is formed as shown in FIG. 16B.

According to the thirteenth embodiment, both of the contact holes 12 and 12' are formed in the self-align manner.

A fourteenth embodiment of the present invention will now be described with reference to FIGS. 17A and 17B.

The fourteenth embodiment is featured in that both of the contact holes in the peripheral circuit portion and the cell portion are formed simultaneously. In the fourteenth embodiment, the process until the diffusion layer 9 is formed in the peripheral circuit portion is similar to that (see FIG. 15D) according to the twelfth embodiment. Therefore, the similar process is omitted from the detailed description.

After the diffusion layer 9 is formed in the peripheral circuit portion, the resist film 11" is applied to the overall surface and the contact hole 12 in the cell portion and the contact hole 12' in the peripheral circuit portion are formed simultaneously in the self-align manner. A portion of the gate insulating film 1 in a region of the contact hole 12' is removed. FIG. 17A shows the cross section of the cell portion and the peripheral circuit portion of the semiconductor apparatus in the foregoing state.

Next, the wiring layer 13 is formed as shown in FIG. 17B.

According to the fourteenth embodiment, both of the contact holes 12 and 12' are formed simultaneously.

A fifteenth embodiment of the present invention will now be described with reference to FIGS. 18A to 18E.

Note that an assumption is performed in this embodiment that the transistors to be formed in the peripheral circuit portion are only n-channel or p-channel transistors.

Similarly to the twelfth embodiment, the fifteenth embodiment has a structure such that the cell portion of the semiconductor apparatus has the structure according to the seventh embodiment and the peripheral circuit portion has the structure according to the sixth embodiment.

FIG. 18A is a cross sectional view showing a semiconductor manufactured by a process similar to that according to the twelfth embodiment.

Then, a process similar to that according to the first embodiment is performed so that the insulating film 14 made of, for example, a SiN film, is deposited on the overall surface. Then, BPSG or the like is employed so that the insulating layer 7 is formed on the insulating film 14. Note that the insulating layer 7 is deposited to have a thickness with which the space between the gates in the cell portion is plugged and with which the space between the gates in the peripheral circuit portion is not plugged. The cell portion and the peripheral circuit portion of the semiconductor apparatus at the above-mentioned manufacturing step are shown in FIG. 18B.

Then, the insulating layer 7 in the peripheral circuit portion is etched so that the side insulating layer 7 made of the insulating layer 7 is formed, as shown in FIG. 18C.

Figure 18D:
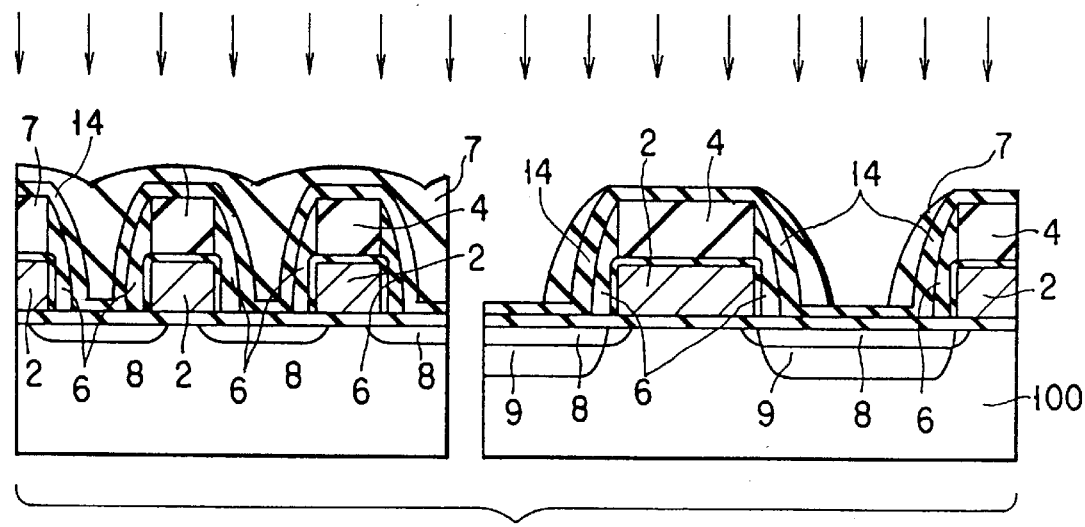

Then, application of, for example, the resist film is not performed. As an alternative to this, for example, an ion implantation method is employed to add impurities, such as arsenic, to the peripheral circuit portion and the cell portion of the semiconductor substrate 100 through the insulating film 14. As a result, a diffusion layer 9 is formed in the peripheral circuit portion. However, the insulating layer 7 and the insulating film 14 serve as masks in the cell portion so that the diffusion layer 9 is not formed. FIG. 18D shows the cross sections of the cell portion and the peripheral circuit portion of the semiconductor apparatus at the foregoing manufacturing step.

Figure 18E:
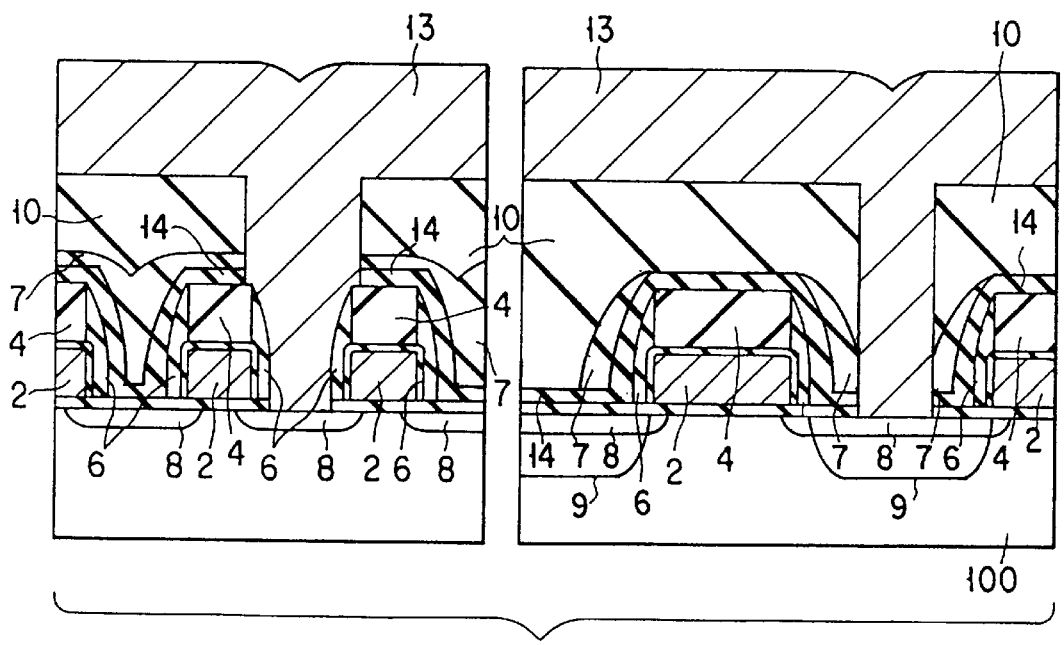
Figure 19A:
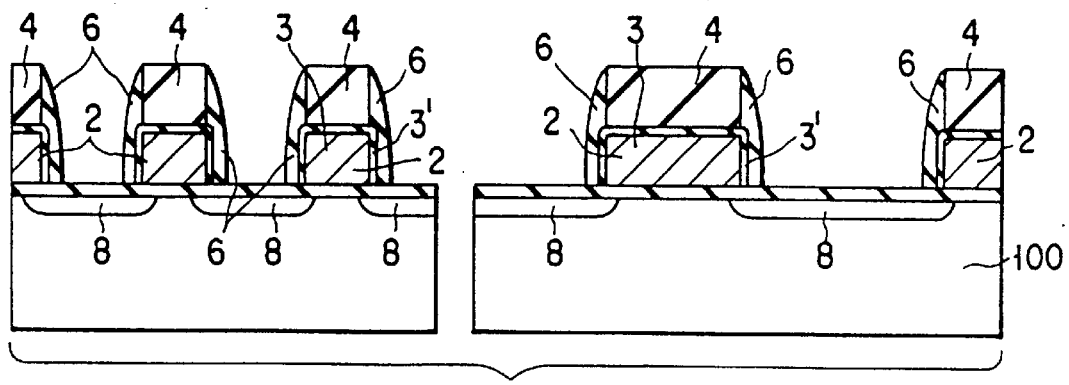
FIGS. 19A to 19G are cross sectional views showing the structure of a semiconductor apparatus in each step of a method of manufacturing a semiconductor apparatus according to a sixteenth embodiment of the present invention.
Figure 19B:
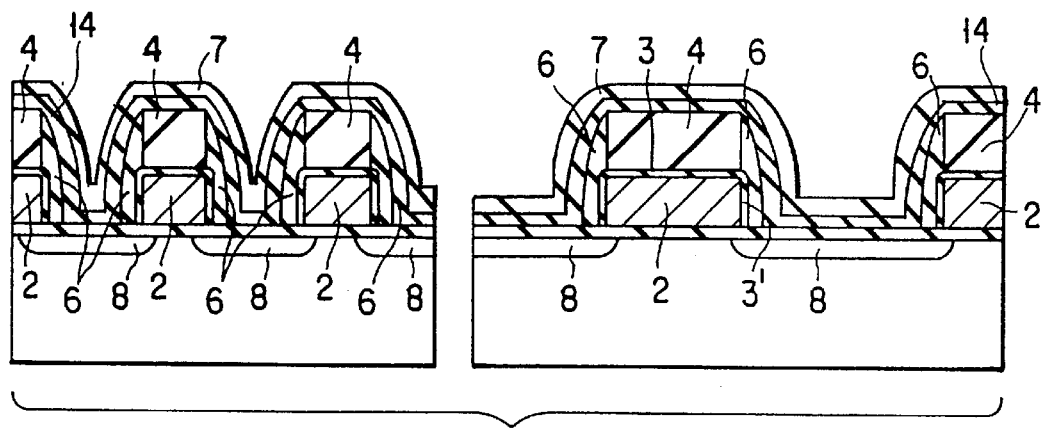
Figure 19C:
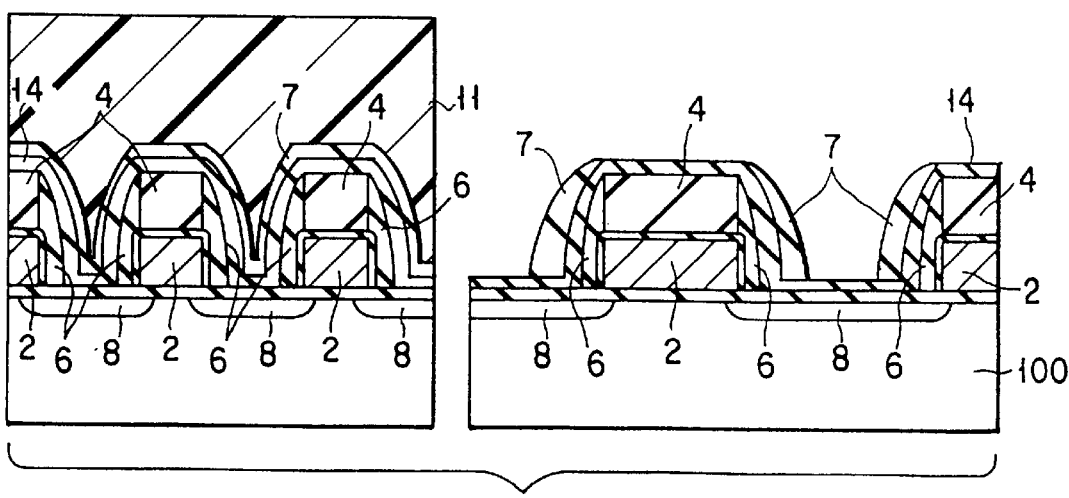
Figure 19D:
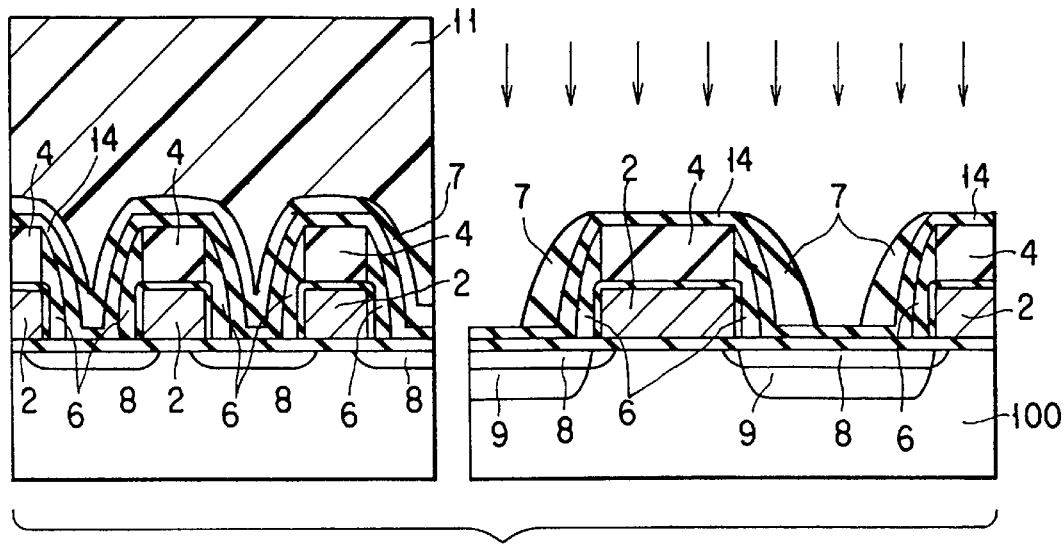
Figure 19E:
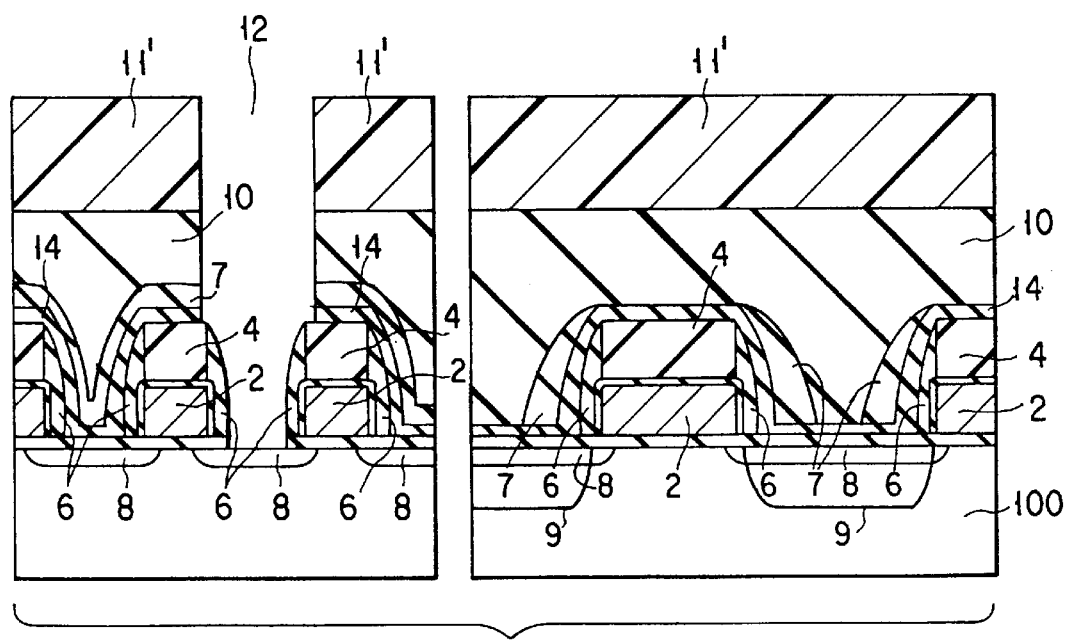
Figure 19F:
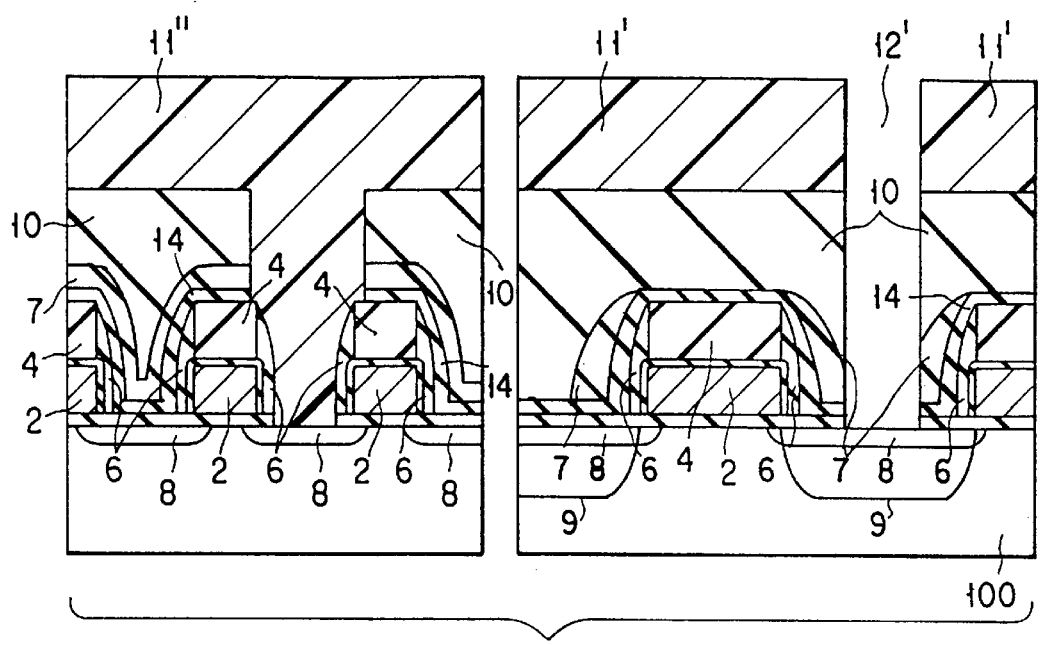
Figure 19G:
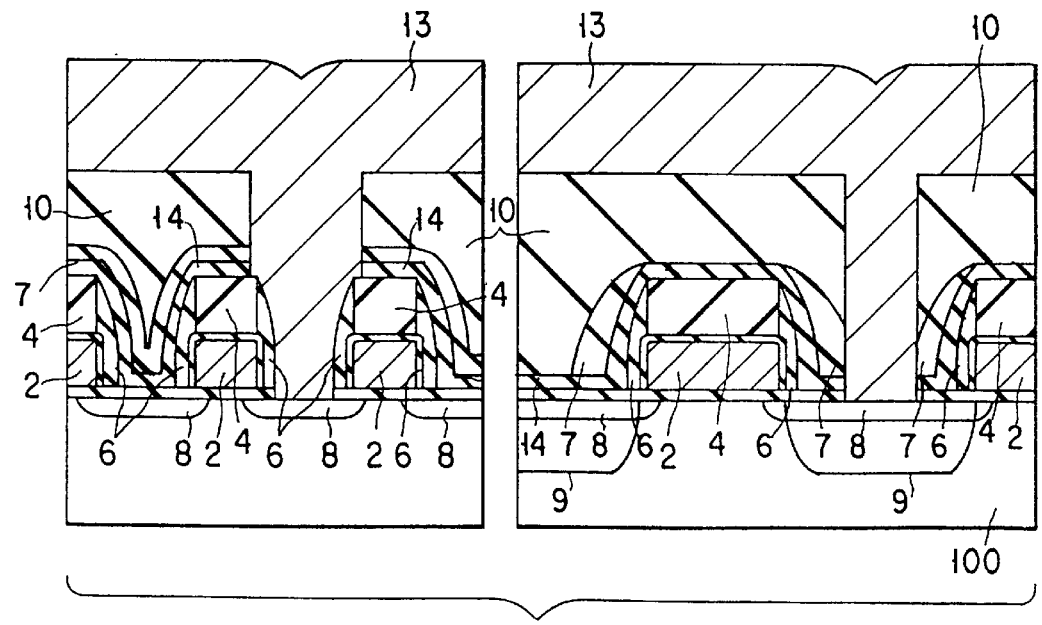

Then, the contact hole is, similarly to the twelfth embodiment, formed in the cell portion and the peripheral circuit portion, and then a wiring layer 13 is formed. FIG. 18E shows the cross sections of the cell portion and the peripheral circuit portion of the semiconductor apparatus at the above-mentioned manufacturing step.

As described above, according to the fifteenth embodiment, the necessity of applying the resist film, required in the twelfth embodiment, can be eliminated when the diffusion layer 9 is formed in a case where the transistors to be formed in the peripheral circuit portion are only n-channel or p-channel transistors.

A sixteenth embodiment of the present invention will now be described with reference to FIGS. 19A to 19G.

The sixteenth embodiment is similar to the twelfth embodiment of the present invention except to that the insulting film 7 is deposited in the cell portion so that the space between the gates in the cell portion is not plugged. Each processes in the sixteenth embodiment is similar to each of processes in the twelfth embodiment. FIGS. 19A to 19G correspond to FIGS. 15A to 15G. Therefore, the similar processes are omitted from the detailed description.

According to the sixteenth embodiment, the peripheral circuit portion has the structure according to the sixth embodiment. In the cell portion, the insulting film 7 is deposited in the cell portion so that the space between the gates in the cell portion is not plugged.

The present invention is not limited to the above-mentioned embodiments. For example, although the diffusion layer having a high pattern density and the low-density diffusion layer having a low pattern density are simultaneously formed by ion implantation, the foregoing diffusion layers may be formed by individual processes.

Although the ninth embodiment has the structure such that the semiconductor apparatus is manufactured which has the region having the high pattern density and the region having the low pattern density by using the method according to the second embodiment, the semiconductor apparatus having both of the region having the high pattern density and the region having the low pattern density may be manufactured by the method according to any one of the first to eighth embodiment or their combination.

As described above, the methods according to the embodiments may arbitrarily be combined and a variety of modifications may be permitted within the scope of the present invention.

The present invention may be applied to a DRAM having memory cells each having a trench capacitor structure or a stack capacitor structure. In this case, the memory cell region generally has a high pattern density. Therefore, the transistor forming the memory cell does not require the diffusion layer 9. Therefore, the method of manufacturing the transistor in the region having the high pattern density according to the foregoing embodiment may be employed to form the transistor for forming the memory cell.

As described above, application of the present invention to the DRAM enables the effective channel length of a fine transistor for forming the peripheral circuit portion to be maintained and the area for the contact hole can be maintained in a region, for example, the memory cell, having a high pattern density.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor apparatus comprising:
   a semiconductor substrate;
   a gate insulating film formed on said semiconductor substrate;
   first and second gate electrodes formed on said gate insulating film and respectively having first and second insulating films laminated thereon;
   side insulating films formed on the side walls of said first and second gate electrodes;
   a wiring layer formed between said first and second gate electrodes;
   a third insulating film for covering a predetermined portion on said first insulating film and said side insulating film opposite to the side wall of said first gate electrode adjacent to said wiring layer;
   a fourth insulating film for covering a predetermined portion on said second insulating film and said side insulating film opposite to the side wall of said second gate electrode adjacent to said wiring layer;
   respective interlayer dielectric films covering the third insulating film and the fourth insulating film;
   a first diffusion layer formed on the two sides of a region which is formed below said first and second gate electrodes and in which a channel will be formed, said first diffusion layer being formed on the surface of said semiconductor substrate; and
   a second diffusion layer having an end adjacent to said region in which said channel will be formed and located more apart from said region in which said channel will be formed than the end of said first diffusion layer adjacent to said region in which said channel will be formed, said second diffusion layer having a bottom portion which is deeper than the bottom portion of said first diffusion layer, wherein etching rates of said third insulating film, said fourth insulating film, and said respective interlayer dielectric films are about the same and higher than etching rates of said first and second insulating films and said side insulating films.

2. A semiconductor apparatus according to claim 1, wherein
   said third insulating film is formed such that the thickness of said predetermined portion is smaller than that of said side insulating films.

3. A semiconductor apparatus according to claim 1, further comprising:
   fifth and sixth insulating films formed on two opposite side insulating films among said plural side insulating films that are formed on said first and second gate electrode such that said fifth and sixth insulating films are in contact with said wiring layer;
   a first interlayer dielectric film formed on said third insulating film;
   a second interlayer dielectric film formed on said fourth insulating film;
   a seventh insulating film formed between said third insulating film and said first interlayer dielectric film and said wiring layer; and
   an eighth insulating film formed between said fourth insulating film and said second insulating film and said wiring layer.

4. A semiconductor apparatus according to claim 1, further comprising:
   a first interlayer dielectric film formed on said third insulating film;
   a second interlayer dielectric film formed on said fourth insulating film;
   a fifth insulating film formed between said first interlayer dielectric film, said first insulating film and said first gate electrode and said wiring layer; and
   a sixth insulating film formed between said second interlayer dielectric film, said second insulating film and said second gate electrode and said wiring layer.

5. A semiconductor apparatus according to claim 1, further comprising:
   a fifth insulating film formed on said first insulating film;
   a sixth insulating film formed on said second insulating film;
   a first interlayer dielectric film formed on said third insulating film;
   a second insulating film formed on said fourth insulating film,
   a seventh insulating film formed between said first interlayer dielectric film and said third insulating film and said wiring layer;
   an eighth insulating film formed between said second interlayer dielectric film and said fourth insulating film and said wiring layer;
   a ninth insulating film formed on the side wall of said first gate electrode adjacent to said wiring layer;
   a tenth insulating film formed on the side wall of said second gate electrode adjacent to said wiring layer;
   an eleventh insulating film formed between said ninth insulating film and said wiring layer; and
   a twelfth insulating film formed between said tenth insulating film and said wiring layer.

6. A semiconductor apparatus according to claim 1, wherein the first and second insulating films and the side insulating films include SiN and the third and fourth insulating films and the respective interlayer dielectric films include BPSG.

7. A semiconductor apparatus comprising:
   a semiconductor substrate;
   a gate insulating film formed on said semiconductor substrate;
   first and second gate electrodes formed on said gate insulating film and respectively having first and second insulating films laminated thereon;

side insulating films formed on the side walls of said first and second gate electrodes;

a wiring layer formed between said first and second gate electrodes;

a first BPSG film covering a predetermined portion on said first insulating film and said side insulating film opposite to the side wall of said first gate electrode adjacent to said wiring layer;

a second BSPG film covering a predetermined portion on said second insulating film and said side insulating film opposite to the side wall of said second gate electrode adjacent to said wiring layer;

respective interlayer BSG films covering the first BPSG film and the second BPSG film;

a first diffusion layer formed on the two sides of a region which is formed below said first and second gate electrodes and in which a channel will be formed, said first diffusion layer being formed on the surface of said semiconductor substrate; and a second diffusion layer having an end adjacent to said region in which said channel will be formed and located more apart from said region in which said channel will be formed than the end of said first diffusion layer adjacent to said region in which said channel will be formed, said second diffusion layer having a bottom portion which is deeper than the bottom portion of said first diffusion layer, wherein etching rates of the first BPSG film, the second BPSG film and the respective interlayer BSG films are higher than etching rates of the first and second films and the side insulating films.

* * * * *